US008428758B2

(12) United States Patent
Naik et al.

(10) Patent No.: US 8,428,758 B2
(45) Date of Patent: Apr. 23, 2013

(54) DYNAMIC AUDIO DUCKING

(75) Inventors: Devang Kalidas Naik, San Jose, CA (US); Kim Ernest Alexander Silverman, Mountain View, CA (US); Baptiste Pierre Paquier, Saratoga, CA (US); ShawShin Zhang, Mountain View, CA (US); Benjamin Andrew Rottler, San Francisco, CA (US)

(73) Assignee: Apple Inc., Cupertino, CA (US)

(*) Notice: Subject to any disclaimer, the term of this patent is extended or adjusted under 35 U.S.C. 154(b) by 1101 days.

(21) Appl. No.: 12/371,861

(22) Filed: Feb. 16, 2009

(65) Prior Publication Data

US 2010/0211199 A1 Aug. 19, 2010

(51) Int. Cl.
*G06F 17/00* (2006.01)
*G06F 3/16* (2006.01)
*H03G 3/20* (2006.01)
*H03G 3/00* (2006.01)

(52) U.S. Cl.
USPC ................ 700/94; 381/57; 381/107; 715/727

(58) Field of Classification Search .................... 381/56, 381/57, 73.1, 94.5, 107, 108; 700/94; 715/716, 715/727
See application file for complete search history.

(56) References Cited

U.S. PATENT DOCUMENTS 7,454,331 B2 11/2008 Vinton et al.
7,825,322 B1 * 11/2010 Classen et al. .................. 84/622
2004/0027369 A1 * 2/2004 Kellock et al. ................ 345/716
2004/0148043 A1 * 7/2004 Choi .............................. 700/94
2006/0002572 A1 1/2006 Smithers et al.
2006/0168150 A1 7/2006 Naik et al.
2007/0180383 A1 8/2007 Naik
2007/0292106 A1 * 12/2007 Finkelstein et al. ............ 386/55

OTHER PUBLICATIONS

Yamaha, "Digital Mixing Engine DME32 Owner's Manual", 2000, Yamaha, pp. 133-134.*
Nilsson, Martin, "ID3 tag version 2.4.0—Native Frames", Jul. 27, 2003, v1.1, p. 16.*
Adobe, "Adobe Audition User Guide", 2003, Adobe Systems Incorporated, pp. 317-320.*
U.S. Appl. No. 12/286,316, filed Sep. 30, 2008, Lin et al.
U.S. Appl. No. 12/286,447, filed Sep. 30, 2008, Lin et al.

* cited by examiner

*Primary Examiner* — Jesse Elbin
(74) *Attorney, Agent, or Firm* — Blakely, Sokoloff, Taylor & Zafman LLP

(57) ABSTRACT

Various dynamic audio ducking techniques are provided that may be applied where multiple audio streams, such as a primary audio stream and a secondary audio stream, are being played back simultaneously. For example, a secondary audio stream may include a voice announcement of one or more pieces of information pertaining to the primary audio stream, such as the name of the track or the name of the artist. In one embodiment, the primary audio data and the voice feedback data are initially analyzed to determine a loudness value. Based on their respective loudness values, the primary audio stream may be ducked during the period of simultaneous playback such that a relative loudness difference is generally maintained with respect to the loudness of the primary and secondary audio streams. Accordingly, the amount of ducking applied may be customized for each piece of audio data depending on its loudness characteristics.

35 Claims, 18 Drawing Sheets

252

DYNAMIC AUDIO DUCKING

BACKGROUND

1. Technical Field

Embodiments of the present disclosure relate generally to controlling the concurrent playback of multiple media files and, more particularly, to a technique for adaptively ducking one of the media files during the period of concurrent playback.

2. Description of the Related Art

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

In recent years, the growing popularity of digital media has created a demand for digital media player devices, which may be portable or non-portable. In addition to providing for the playback of digital media, such as music files, some digital media players may also provide for the playback of secondary media items that may be utilized to enhance the overall user experience. For instance, secondary media items may include voice feedback files providing information about a current primary track that is being played on a device. As will be appreciated, voice feedback data may be particularly useful where a digital media player has limited or no display capabilities, or if the device is being used by a disabled person (e.g., visually impaired).

When outputting voice feedback and media concurrently (e.g., mixing), it is generally preferable to "duck" the primary audio file such that the volume of the primary audio file is temporarily reduced during a concurrent playback period in which the voice feedback data is mixed into the audio stream. The desired result from ducking the primary audio stream is typically that the audibility the voice feedback data is improved from the viewpoint of a listener.

Known ducking techniques may rely upon hard-coded values for controlling the loudness of primary audio files during periods in which voice feedback data is being played simultaneously. However, these techniques generally do not take in account intrinsic factors of the audio files, such as genre or loudness information. For instance, where a primary audio file is extremely loud or constitutes speech-based data (e.g., an audiobook), ducking the primary audio file based on a hard-coded or preset ducking value may not always be sufficient to provide an aesthetically pleasing composite output stream. For example, if the primary media is ducked too little, the combined gain of the composite audio stream (e.g., with the simultaneous voice feedback) may exceed the power output threshold of an associated output device (e.g., speaker, headphone, etc.). This may result in clipping and/or distortion of the combined audio output signal, thus negatively impacting the user experience. Further, if the primary audio file is already very "soft" (e.g., having a low loudness), then additional ducking of the primary audio file may cause a user to perceive the secondary voice feedback data as being "too loud." Accordingly, there are continuing efforts to further improve the user experience with respect to digital media player devices.

SUMMARY

Certain aspects of embodiments disclosed herein by way of example are summarized below. It should be understood that these aspects are presented merely to provide the reader with a brief summary of certain forms that the various techniques disclosed and/or claimed herein might take and that these aspects are not intended to limit the scope of any technique disclosed and/or claimed herein. Indeed, any technique disclosed and/or claimed herein may encompass a variety of aspects that may not be set forth below.

The present disclosure generally relates to various dynamic audio ducking techniques that may be applied in situations where multiple audio streams, such as a primary audio stream and a secondary audio stream, are being played back simultaneously. For example, a secondary audio stream may include a voice announcement of one or more pieces of information pertaining to the primary audio stream, such as the name of the track or the name of the artist. In one embodiment, the primary audio data and the voice feedback data are initially analyzed to determine a loudness value. Based on their respective loudness values, the primary audio stream may be ducked during the period of simultaneous playback so that a relative loudness difference is generally maintained with respect to the loudness of the primary and secondary audio streams. Thus, the amount of ducking applied may be customized for each piece of audio data depending on its inherent loudness characteristics.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. Again, the brief summary presented above is intended only to familiarize the reader with certain aspects and contexts of embodiments of the present disclosure without limitation to the claimed subject matter.

DESCRIPTION OF THE DRAWINGS

These and other features, aspects, and advantages of the present disclosure will become better understood when the following detailed description of certain exemplary embodiments is read with reference to the accompanying drawings in which like characters represent like parts throughout the drawings, wherein.

DETAILED DESCRIPTION OF SPECIFIC EMBODIMENTS

Figure 1:
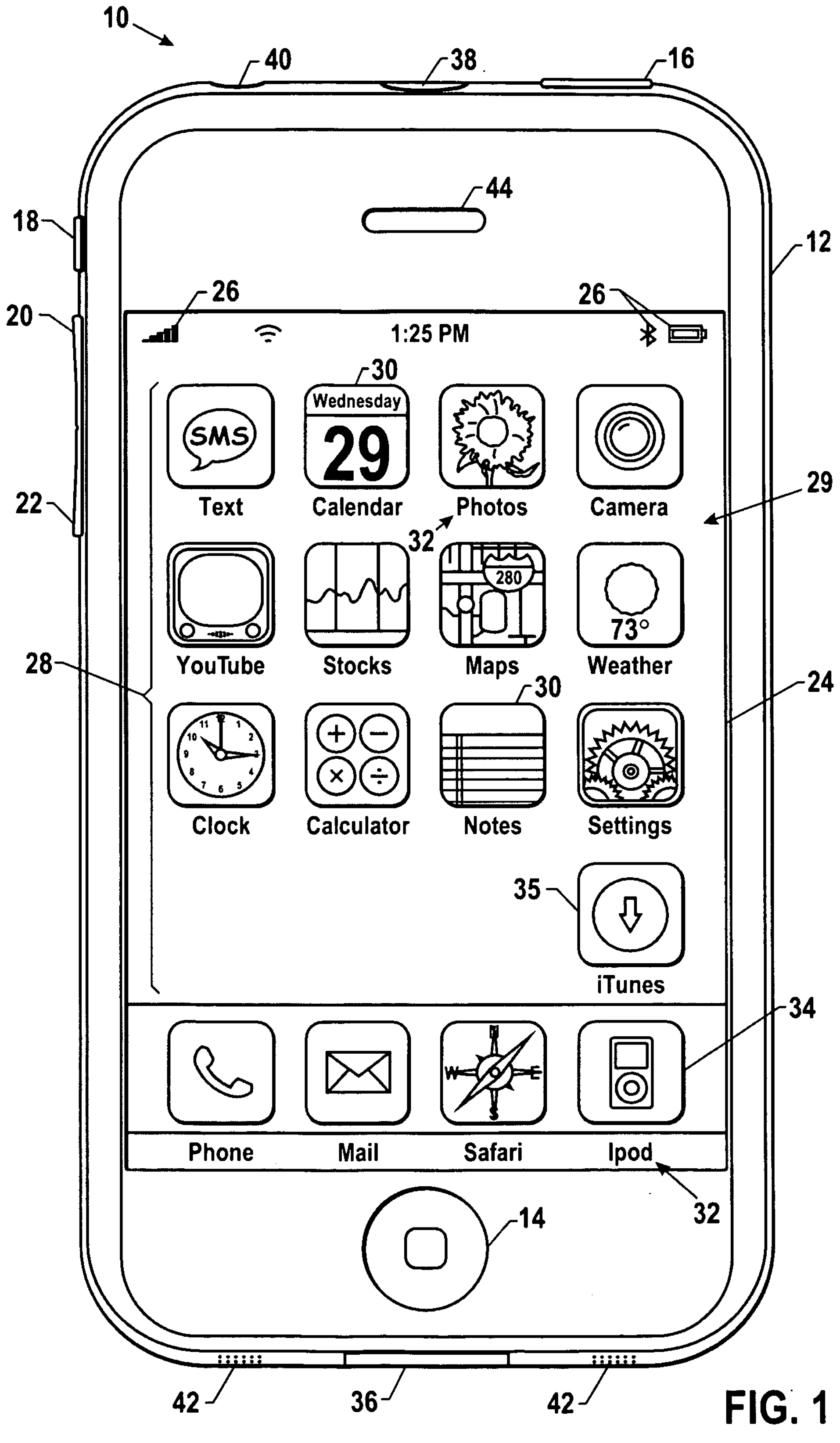
FIG. 1 is a front view of an electronic device, in accordance with an embodiment of the present technique.

One or more specific embodiments of the present disclosure will be described below. These described embodiments are only exemplary of the presently disclosed techniques. Additionally, in an effort to provide a concise description of these exemplary embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present invention are not intended to be interpreted as excluding the existence of additional embodiments that also incorporate the recited features.

The present disclosure generally provides various dynamic audio ducking techniques that may be utilized during the playback of digital media files. Particularly, the audio ducking techniques described herein may be applied during the simultaneous playback of multiple media files, such as a primary media item and a secondary media item. In certain embodiments, the primary and secondary media items may have loudness values associated therewith. Based upon their respective loudness values, the presently disclosed techniques may include ducking one of the primary or secondary media items during the period of concurrent playback to maintain a relative loudness difference between the primary and secondary media items. The present techniques may improve the audio perceptibility of the unducked media item from the viewpoint of a listener during the period of concurrent playback, thereby enhancing a user's listening experience.

Before continuing, several of the terms mentioned above, which will be used extensively throughout the present disclosure, will be first defined in order to facilitate a better understanding of disclosed subject matter. For instance, as used herein, the term "primary," as applied to media, shall be understood to refer to a main audio track that a user generally selects for listening whether it be for entertainment, leisure, educational, or business purposes, to name just a few. By way of example only, a primary media file may include music data (e.g., a song by a recording artist) or speech data (e.g., an audiobook or news broadcast). In some instances, a primary media file may be a primary audio track associated with video data and may be played back concurrently as a user views the video data (e.g., a movie or music video).

The term "secondary," as applied to media, shall be understood to refer to non-primary media files that are typically not directly selected by a user for listening purposes, but may be played back upon detection of a feedback event. Generally, secondary media may be classified as either "voice feedback data" or "system feedback data." "Voice feedback data" shall be understood to mean audio data representing information about a particular primary media item, such as information pertaining to the identity of a song, artist, and/or album, and may be played back in response to a feedback event (e.g., a user-initiated or system-initiated track or playlist change) to provide a user with audio information pertaining to a primary media item being played. Further, it shall be understood that the term "enhanced media item" or the like is meant to refer to primary media items having such secondary voice feedback data associated therewith.

"System feedback data" shall be understood to refer to audio feedback that is intended to provide audio information pertaining to the status of a media player application and/or an electronic device executing a media player application. For instance, system feedback data may include system event or status notifications (e.g., a low battery warning tone or message). Additionally, system feedback data may include audio feedback relating to user interaction with a system interface, and may include sound effects, such as click or beep tones as a user selects options from and/or navigates through a user interface (e.g., a graphical interface). Further, with regard to the audio ducking techniques that will be described in further detail below, the term "duck" or "ducking" or the like, shall be understood to refer to an adjustment of loudness with regard to either a primary or secondary media item during at least a portion of a period in which the primary and the secondary item are being played simultaneously.

Keeping the above-defined terms in mind, certain embodiments are discussed below with reference to FIGS. 1-21. Those skilled in the art will readily appreciate that the detailed description given herein with respect to these figures is merely intended to provide, by way of example, certain forms that embodiments of the invention may take. That is, the disclosure should not be construed as being limited only to the specific embodiments discussed herein.

Turning now to the drawings and referring initially to FIG. 1, a handheld processor-based electronic device that may include an application for playing media files is illustrated and generally referred to by reference numeral 10. While the techniques below are generally described with respect to media playback functions, it should be appreciated that various embodiments of the handheld device 10 may include a number of other functionalities, including those of a cell phone, a personal data organizer, or some combination thereof. Thus, depending on the functionalities provided by the electronic device 10, a user may listen to music, play games, take pictures, and place telephone calls, while moving freely with the device 10. In addition, the electronic device 10 may allow a user to connect to and communicate through the Internet or through other networks, such as local or wide area networks. For example, the electronic device 10 may allow a user to communicate using e-mail, text messaging, instant messaging, or other forms of electronic communication. The electronic device 10 also may communicate with other devices using short-range connection protocols, such as Bluetooth and near field communication (NFC). By way of example only, the electronic device 10 may be a model of an iPod® or an iPhone®, available from Apple Inc. of Cupertino, Calif. Additionally, it should be understood that the techniques described herein may be implemented using any type of suitable electronic device, including non-portable electronic devices, such as a personal desktop computer.

In the depicted embodiment, the device 10 includes an enclosure 12 that protects the interior components from physical damage and shields them from electromagnetic interference. The enclosure 12 may be formed from any suitable material such as plastic, metal or a composite material and may allow certain frequencies of electromagnetic radiation to pass through to wireless communication circuitry within the device 10 to facilitate wireless communication.

The enclosure 12 may further provide for access to various user input structures 14, 16, 18, 20, and 22, each being configured to control one or more respective device functions when pressed or actuated. By way of the user input structures, a user may interface with the device 10. For instance, the input structure 14 may include a button that when pressed or actuated causes a home screen or menu to be displayed on the device. The input structure 16 may include a button for toggling the device 10 between one or more modes of operation, such as a sleep mode, a wake mode, or a powered on/off mode. The input structure 18 may include a dual-position sliding structure that may mute or silence a ringer in embodiments where the device 10 includes cell phone functionality. Further, the input structures 20 and 22 may include buttons for increasing and decreasing the volume output of the device 10. It should be understood that the illustrated input structures 14, 16, 18, 20, and 22 are merely exemplary, and that the electronic device 10 may include any number of user input structures existing in various forms including buttons, switches, control pads, keys, knobs, scroll wheels, and so forth, depending on specific implementation requirements.

The device 10 further includes a display 24 configured to display various images generated by the device 10. The display 24 may also display various system indicators 26 that provide feedback to a user, such as power status, signal strength, call status, external device connections, or the like. The display 24 may be any type of display such as a liquid crystal display (LCD), a light emitting diode (LED) display, an organic light emitting diode (OLED) display, or other suitable display. Additionally, in certain embodiments of the electronic device 8, the display 10 may include a touch-sensitive element, such as a touch screen interface.

As further shown in the present embodiment, the display 24 may be configured to display a graphical user interface ("GUI") 28 that allows a user to interact with the device 10. The GUI 28 may include various graphical layers, windows, screens, templates, elements, or other components that may be displayed on all or a portion of the display 24. For instance, the GUI 28 may display a plurality of graphical elements, shown here as a plurality of icons 30. By default, such as when the device 10 is first powered on, the GUI 28 may be configured to display the illustrated icons 30 as a "home screen," referred to by the reference numeral 29. In certain embodiments, the user input structures 14, 16, 18, 20, and 22, may be used to navigate through the GUI 28 and (e.g., away from the home screen 29). For example, one or more of the user input structures may include a wheel structure that may allow a user to select various icons 30 displayed by the GUI 28. Additionally, the icons 30 may also be selected via the touch screen interface.

The icons 30 may represent various layers, windows, screens, templates, elements, or other graphical components that may be displayed in some or all of the areas of the display 24 upon selection by the user. Furthermore, the selection of an icon 30 may lead to or initiate a hierarchical screen navigation process. For instance, the selection of an icon 30 may cause the display 24 to display another screen that includes one or more additional icons 30 or other GUI elements. As will be appreciated, the GUI 28 may have various components arranged in hierarchical and/or non-hierarchical structures.

In the present embodiment, each icon 30 may be associated with a corresponding textual indicator 32, which may be displayed on or near its respective icon 30. For example, the icon 34 may represent a media player application, such as the iPod® or iTunes® application available from Apple Inc. The icon 35 may represent an application providing the user an interface to an online digital media content provider. By way of the example, the digital media content provider may be an online service providing various downloadable digital media content, including primary (e.g., non-enhanced) or enhanced media items, such as music files, audiobooks, or podcasts, as well as video files, software applications, programs, video games, or the like, all of which may be purchased by a user of the device 10 and subsequently downloaded to the device 10. In one implementation, the online digital media provider may be the iTunes® digital media service offered by Apple Inc.

The electronic device 10 may also include various input/output (I/O) ports, such as the illustrated I/O ports 36, 38, and 40. These I/O ports may allow a user to connect the device 10 to or interface the device 10 with one or more external devices and may be implemented using any suitable interface type such as a universal serial bus (USB) port, serial connection port, FireWire port (IEEE-1394), or AC/DC power connection port. For example, the input/output port 36 may include a proprietary connection port for transmitting and receiving data files, such as media files. The input/output port 38 may include a connection slot for receiving a subscriber identify module (SIM) card, for instance, where the device 10 includes cell phone functionality. The input/output port 40 may be an audio jack that provides for connection of audio headphones or speakers. As will appreciated, the device 10 may include any number of input/output ports configured to connect to a variety of external devices, such as to a power source, a printer, and a computer, or an external storage device, just to name a few.

Certain I/O ports may be configured to provide for more than one function. For instance, in one embodiment, the I/O port 36 may be configured to not only transmit and receive data files, as described above, but may be further configured to couple the device to a power charging interface, such as an power adaptor designed to provide power from a electrical wall outlet, or an interface cable configured to draw power from another electrical device, such as a desktop computer. Thus, the I/O port 36 may be configured to function dually as both a data transfer port and an AC/DC power connection port depending, for example, on the external component being coupled to the device 10 via the I/O port 36.

The electronic device 10 may also include various audio input and output elements. For example, the audio input/output elements, depicted generally by reference numeral 42, may include an input receiver, which may be provided as one or more microphone devices. For instance, where the electronic device 10 includes cell phone functionality, the input receivers may be configured to receive user audio input such as a user's voice. Additionally, the audio input/output elements 42 may include one or more output transmitters. Thus, where the device 10 includes a media player application, the output transmitters of the audio input/output elements 42 may include one or more speakers for transmitting audio signals to a user, such as playing back music files, for example. Further, where the electronic device 10 includes a cell phone application, an additional audio output transmitter 44 may be provided, as shown in FIG. 1. Like the output transmitter of the audio input/output elements 42, the output transmitter 44 may also include one or more speakers configured to transmit audio signals to a user, such as voice data received during a telephone call. Thus, the input receivers and the output transmitters of the audio input/output elements 42 and the output transmitter 44 may operate in conjunction to function as the audio receiving and transmitting elements of a telephone. Further, where a headphone or speaker device is connected to an appropriate I/O port (e.g., port 40), the headphone or speaker device may function as an audio output element for the playback of various media.

Figure 2:
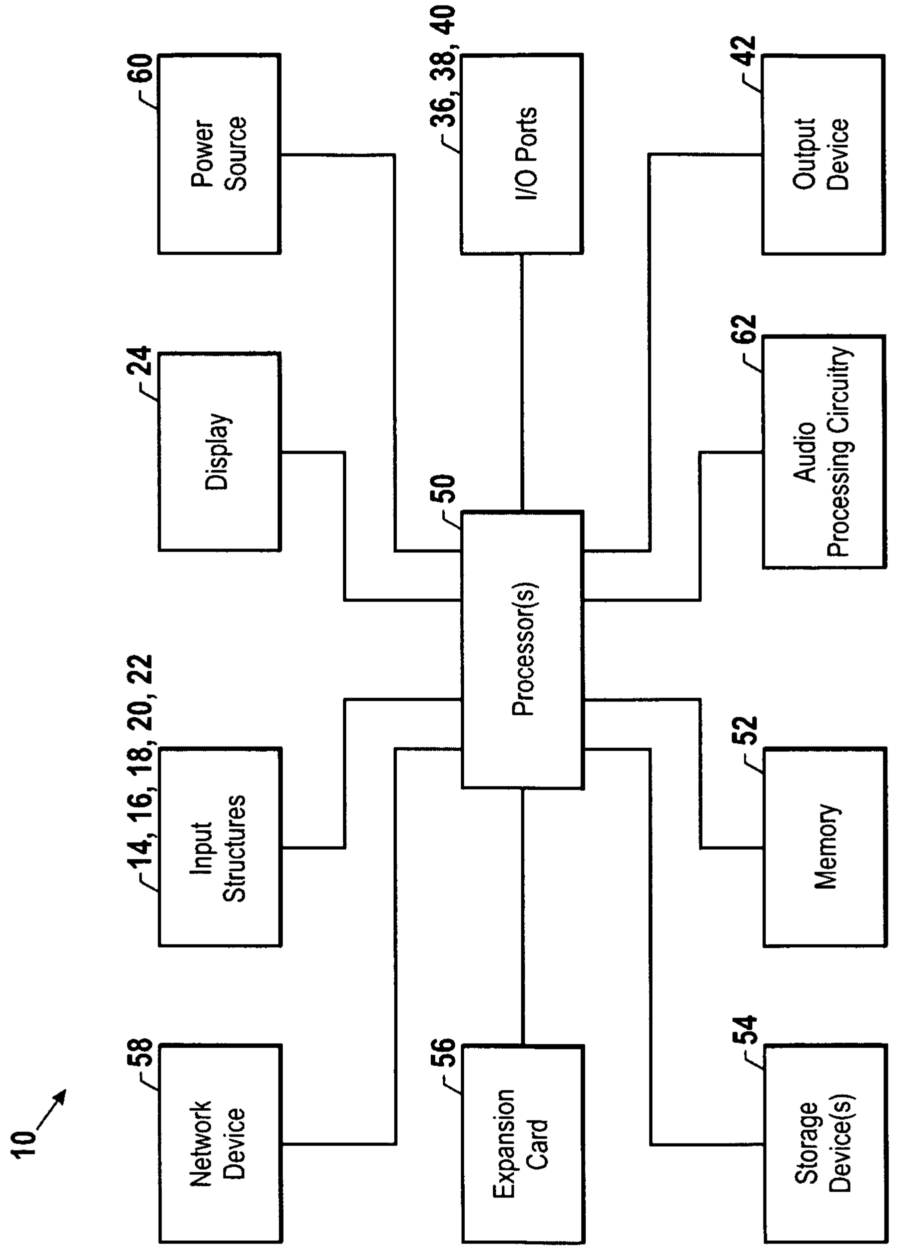
FIG. 2 is a simplified block diagram depicting components which may be used in the electronic device shown in FIG. 1.

Additional details of the illustrative device 10 may be better understood through reference to FIG. 2, which is a block diagram illustrating various components and features of the device 10 in accordance with one embodiment of the present invention. As shown in FIG. 2, the device 10 includes input structures 14, 16, 18, 20, and 22, display 24, the I/O ports 36, 38, and 40, and the output device, which may be an output transmitter (e.g., a speaker) associated with the audio input/output element 42, as discussed above. The device 10 may also include one or more processors 50, a memory 52, a storage device 54, card interface(s) 56, a networking device 58, a power source 60, and an audio processing circuit 62.

The operation of the device 10 may be generally controlled by one or more processors 50, which may provide the processing capability required to execute an operating system, application programs (e.g., including the media player application 34, and the digital media content provider interface application 35), the GUI 28, and any other functions provided on the device 10. The processor(s) 50 may include a single processor or, in other embodiments, it may include a plurality of processors. By way of example, the processor 50 may include "general purpose" microprocessors, a combination of general and application-specific microprocessors (ASICs), instruction set processors (e.g., RISC), graphics processors, video processors, as well as related chips sets and/or special purpose microprocessors. The processor(s) 50 may be coupled to one or more data buses for transferring data and instructions between various components of the device 10.

The electronic device 10 may also include a memory 52. The memory 52 may include a volatile memory, such as RAM, and/or a non-volatile memory, such as ROM. The memory 52 may store a variety of information and may be used for a variety of purposes. For example, the memory 52 may store the firmware for the device 10, such as an operating system for the device 10, and/or any other programs or executable code necessary for the device 10 to function. In addition, the memory 24 may be used for buffering or caching during operation of the device 10.

In addition to the memory 52, the device 10 may also include non-volatile storage 54, such as ROM, flash memory, a hard drive, any other suitable optical, magnetic, or solid-state storage medium, or a combination thereof. The storage device 54 may store data files, including primary media files (e.g., music and video files) and secondary media files (e.g., voice or system feedback data), software (e.g., for implementing functions on device 10), preference information (e.g., media playback preferences), transaction information (e.g., information such as credit card information), wireless connection information (e.g., information that may enable media device to establish a wireless connection such as a telephone connection), contact information (e.g., telephone numbers or email addresses), and any other suitable data.

The embodiment in FIG. 2 also includes one or more card expansion slots 56. The card slots 56 may receive expansion cards that may be used to add functionality to the device 10, such as additional memory, I/O functionality, or networking capability. The expansion card may connect to the device 10 through a suitable connector and may be accessed internally or externally to the enclosure 12. For example, in one embodiment the card may be a flash memory card, such as a SecureDigital (SD) card, mini- or microSD, CompactFlash card, Multimedia card (MMC), etc. Additionally, in some embodiments a card slot 56 may receive a Subscriber Identity Module (SIM) card, for use with an embodiment of the electronic device 10 that provides mobile phone capability.

The device 10 depicted in FIG. 2 also includes a network device 58, such as a network controller or a network interface card (NIC). In one embodiment, the network device 58 may be a wireless NIC providing wireless connectivity over an 802.11 standard or any other suitable wireless networking standard. The network device 58 may allow the device 10 to communicate over a network, such as a local area network, a wireless local area network, or a wide area network, such as an Enhanced Data rates for GSM Evolution (EDGE) network or the 3G network (e.g., based on the IMT-2000 standard). Additionally, the network device 58 may provide for connectivity to a personal area network, such as a Bluetooth® network, an IEEE 802.15.4 (e.g., ZigBee) network, or an ultra wideband network (UWB). The network device 58 may further provide for close-range communications using an NFC interface operating in accordance with one or more standards, such as ISO 18092, ISO 21481, or the TransferJet® protocol.

As will be understood, the device 10 may use the network device 58 to connect to and send or receive data other devices on a common network, such as portable electronic devices, personal computers, printers, etc. For example, in one embodiment, the electronic device 10 may connect to a personal computer via the network device 30 to send and receive data files, such as primary and/or secondary media files. Alternatively, in some embodiments the electronic device may not include a network device 58. In such an embodiment, a NIC may be added into card slot 56 to provide similar networking capability as described above.

The device 10 may also include or be connected to a power source 60. In one embodiment, the power source 60 may be a battery, such as a Li-Ion battery. In such embodiments, the battery may be rechargeable, removable, and/or attached to other components of the device 10. Additionally, in certain embodiments the power source 60 may be an external power source, such as a connection to AC power, and the device 10 may be connected to the power source 60 via an I/O port 36.

To facilitate the simultaneous playback of primary and secondary media, the device 10 may include an audio processing circuit 62. In some embodiments, the audio processing circuit 62 may include a dedicated audio processor, or may operate in conjunction with the processor 50. The audio processing circuitry 62 may perform a variety functions, including decoding audio data encoded in a particular format, mixing respective audio streams from multiple media files (e.g., a primary and a secondary media stream) to provide a composite mixed output audio stream, as well as providing for fading, cross fading, or ducking of audio streams.

As described above, the storage device 54 may store a number of media files, including primary media files, secondary media files (e.g., including voice feedback and system feedback media). As will be appreciated, such media files may be compressed, encoded and/or encrypted in any suitable format. Encoding formats may include, but are not limited to, MP3, AAC or AACPlus, Ogg Vorbis, MP4, MP3Pro, Windows Media Audio, or any suitable format. To playback media files stored in the storage 54, the files may need to be first decoded. Decoding may include decompressing (e.g., using a codec), decrypting, or any other technique to convert data from one format to another format, and may be performed by the audio processing circuitry 62. Where multiple media files, such as a primary and secondary media file are to be played concurrently, the audio processing circuitry 62 may decode each of the multiple files and mix their respective audio streams in order to provide a single mixed audio stream. Thereafter, the mixed stream is output to an audio output element, which may include an integrated speaker associated with the audio input/output elements 42, or a headphone or external speaker connected to the device 10 by way of the I/O port 40. In some embodiments, the decoded audio data may be converted to analog signals prior to playback.

The audio processing circuitry 62 may further include logic configured to provide for a variety of dynamic audio ducking techniques, which may be generally directed to adaptively controlling the loudness or volume of concurrently outputted audio streams. As discussed above, during the concurrent playback of a primary media file (e.g., a music file) and a secondary media file (e.g., a voice feedback file), it may be desirable to adaptively duck the volume of the primary media file for a duration in which the secondary media file is being concurrently played in order to improve audio perceptibility from the viewpoint to a listener/user. In certain embodiments, as will be described further below, the audio processing circuitry 62 may perform ducking techniques by identifying the loudness of concurrently played primary and secondary media files, and ducking one of the primary or secondary media files in order to maintain a desired relative loudness difference between the primary and secondary media files during the period of concurrent playback. In one embodiment, loudness data may be encoded in the media files, such as in metadata or meta-information associated with a particular media file, and may become accessible or readable as the media files are decoded by the audio processing circuitry 62.

Though not specifically shown in FIG. 2, it should be appreciated that the audio processing circuitry 62 may include a memory management unit for managing access to dedicated memory (e.g., memory only accessible for use by the audio processing circuit 62). The dedicated memory may include any suitable volatile or non-volatile memory, and may be separate from, or a part of, the memory 52 discussed above. In other embodiments, the audio processing circuitry 62 may share and use the memory 52 instead of or in addition to the dedicated audio memory. It should be understood that the dynamic audio ducking logic mentioned above may be stored in a dedicated memory or the main memory 52.

Figure 3:
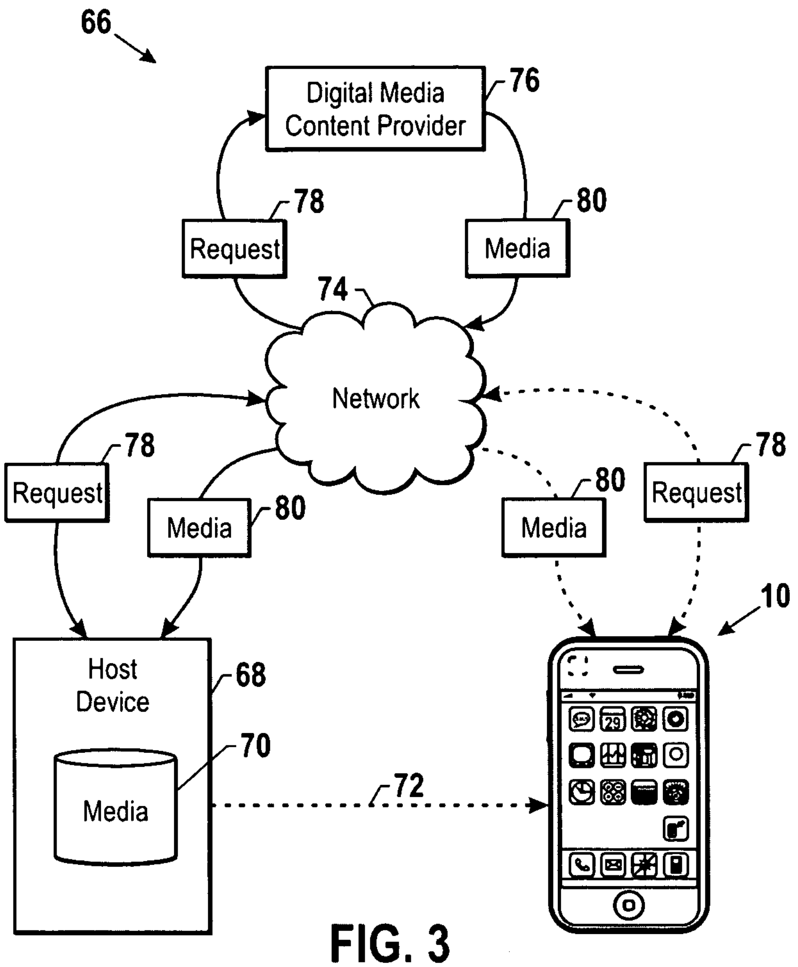
FIG. 3 is a schematic illustration of a networked system through which digital media may be requested from a digital media content provider, in accordance with an embodiment of the present technique.

Referring now to FIG. 3, a networked system 66 through which media items may be transferred between a host device (e.g., a personal desktop computer) 68, the portable handheld device 10, or a digital media content provider 76 is illustrated. As shown, a host device 68 may include a media storage device 70. Though referred to as a media storage device 70, it should be understood that the storage device may be any type of general purpose storage device, including those discussed above with reference to the storage device 54, and need not be specifically dedicated to the storage of media data 80.

In the present implementation, media data 80 stored by the storage device 70 on the host device 68 may be obtained from a digital media content provider 76. As discussed above, the digital media content provider 76 may be an online service, such as iTunes®, providing various primary media items (e.g., music, audiobooks, etc.), as well as electronic books, software, or video games, that may be purchased and downloaded to the host device 68. In one embodiment, the host device 68 may execute a media player application that includes an interface to the digital media content provider 76. The interface may function as a virtual store through which a user may select one or more media items 80 of interest for purchase. Upon identifying one or more media items 80 of interest, a request 78 may be transmitted from the host device 68 to the digital media content provider 76 by way of the network 74, which may include a LAN, WLAN, WAN, or PAN network, or some combination thereof. The request 78 may include a user's subscription or account information and may also include payment information, such as a credit card account. Once the request 78 has been approved (e.g., user account and payment information verified), the digital media content provider 76 may authorize the transfer of the requested media 80 to the host device 68 by way of the network 74.

Once the requested media item 80 is received by the host device 68, it may be stored in the storage device 70 and played back on the host device 68 using a media player application. Additionally, the media item 80 may further be transmitted to the portable device 10, either by way of the network 74 or by a physical data connection, represented by the dashed line 72. By way of example, the connection 72 may be established by coupling the device 10 (e.g., using the I/O port 36) to the host device 68 using a suitable data cable, such as a USB cable. In one embodiment, the host device 68 may be configured synchronize data stored in the media storage 70 with the device 10. The synchronization process may be manually performed by a user, or may be automatically initiated upon detecting the connection 72 between the host device 68 and the device 10. Thus, any new media data (e.g., media item 80), that was not stored in the storage 70 during the previous synchronization will be transferred to the device 10. As can be appreciated, the number of devices that may "share" the purchased media 80 may be limited depending on digital rights management (DRM) controls that are typically included with digital media for copyright purposes.

The system 66 may also provide for the direct transfer of the media item 80 between the digital media content provider 76 and the device 10. For instance, instead of obtaining the media item from the host device 68, the device 10, using the network device 58, may connect to the digital media content provider 76 via the network 74 in order to request a media item 80 of interest. Once the request 78 has been approved, the media item 80 may be transferred from the digital media content provider 76 directly to the device 10 using the network 74.

As will be discussed in further detail below, a media item 80 obtained from the digital content provider 76 may include only primary media data or may be an enhanced media item having both primary and secondary media items. Where the media item 80 includes only primary media data, secondary media data, such as voice feedback data may subsequently be created locally on the host device 68 or the portable device 10. Alternatively, the digital media content provider 76 may offer enhanced media items for purchase. For example, the enhanced media items may include pre-associated voice feedback data which may include spoken audio data or commentary by the recording artist. In such embodiments, when the enhanced media file is played back on either the host device 68 or the handheld device 10, the pre-associated voice feedback data may be concurrently played in accordance with an audio ducking scheme, thereby allowing a user to listen to a voice feedback announcement (e.g., artist, track, album, etc.) or commentary that is spoken by the recording artist. In the context of a virtual store setting, enhanced media items having pre-associated voice feedback data may be offered by the digital content provider 76 at a higher price than non-enhanced media items which include only primary media data.

In further embodiments, the requested media item 80 may include only secondary media data. For instance, if a user had previously purchased only a primary media item without voice feedback data, the user may have the option of requesting any available secondary media content separately at a later time for an additional charge in the form of an upgrade. Once received, the secondary media data may be associated with the previously purchased primary media item to create an enhanced media item. These techniques are described in further detail with respect to FIGS. 4-7 below.

Figure 4:
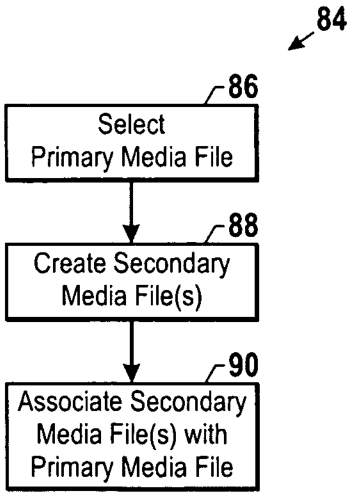
FIG. 4 is a flowchart depicting a method for creating and associating secondary media files with a corresponding primary media file, in accordance with an embodiment of the present technique.

Continuing to FIG. 4, a method 84 is illustrated in which one or more secondary media items are created and associated with a corresponding primary media item. The method 84 begins with the selection of a primary media item at step 86. For example, the selected primary media item 86 may be a media item that was recently downloaded from the digital media content provider 76. Once the primary media item is selected, one or more secondary media items may be created, as shown at step 88. As discussed above, the secondary media items may include voice feedback data and may be created using any suitable technique. In one embodiment, the secondary media items are voice feedback data that may be created using a voice synthesis program. For example, the voice synthesis program may process the primary media item to extract metadata information, which may include information pertaining to a song title, album name, or artist name, to name just a few. The voice synthesis program may process the extracted information to generate one or more audio files representing synthesized speech, such that when played back, a user may hear the song title, album name, and/or artist name being spoken. As will be appreciated, the voice synthesis program may be implemented on the host device 68, the handheld device 10, or on a server associated with the digital media content provider 76. In one embodiment, the voice synthesis program may be integrated into a media player application, such as iTunes®.

In another embodiment, rather than creating and storing secondary voice feedback items, a voice synthesis program may extract metadata information on the fly (e.g., as the primary media item is played back) and output a synthesized voice announcement. Although such an embodiment reduces the need to store secondary media items alongside primary media items, on-the-fly voice synthesis programs that are intended to provide a synthesized voice output on demand are generally less robust, limited to a smaller memory footprint, and may have less accurate pronunciation capabilities when compared to voice synthesis programs that render the secondary voice feedback files prior to playback.

The secondary voice feedback items created at step 86 may be also generated using voice recordings of a user's own voice. For instance, once the primary media item is received (step 84), a user may select an option to speak a desired voice feedback announcement into an audio receiver, such as a microphone device connected to the host device 68, or the audio input/output elements 42 on the handheld device 10. The spoken portion recorded through the audio receiver may be saved as the voice feedback audio data that may be played back concurrently with the primary media item. In some embodiments, the recorded voice feedback data may be in the form of a media monogram or personalized message where the primary media item is intended to be gifted to a recipient. Examples of such messages are disclosed in the following co-pending and commonly assigned applications: U.S. patent application Ser. No. 11/369,480, entitled "Media Presentation with Supplementary Media" filed Mar. 6, 2006; U.S. patent application Ser. No. 12/286,447, entitled "Media Gifting Devices and Methods," filed Sep. 30, 2008; U.S. patent application Ser. No. 12/286,316, entitled "System and Method for Processing Media Gifts," filed Sep. 30, 2008. The entirety of these co-pending applications is hereby incorporated by reference for all purposes.

Next, the method 84 concludes at step 90, wherein the secondary media items created at step 88 are associated with the primary media item received at step 86. As mentioned above, the association of primary and secondary media items may collectively be referred to as an enhanced media item. As will be discussed in further detail below, depending on the configuration of a media player application, upon playback of the enhanced media item, secondary media data may be played concurrently with at least a portion of the primary media item to provide a listener with information about the primary media item using voice feedback.

As will be appreciated, the method 84 shown in FIG. 4 may be implemented by either the host device 68, the handheld device 10. For example, where the method 84 is performed by the host device 68, the selected primary media item (step 86) may be received from the digital media content provider 76 and the secondary media items may be created (step 88) locally using either the voice synthesis or voice recording techniques summarize above to create enhanced media items (step 90). The enhanced media items may subsequently be transferred from the host device 68 to the handheld device 10 by a synchronization operation, as discussed above. Additionally, in an embodiment where the method 84 is performed on the handheld device 10, the selected primary media item (step 86) may be received from either the host device 68 or the digital media content provider 76. The handheld device 10 may create the necessary secondary media items (step 88) using one or more of the techniques described above. Thereafter, the created secondary media items may be associated with the primary media item (step 90) to create enhanced media items which may be played back on the handheld device 10. The method 84 may also be performed by the digital media content provider 76. For instance, voice feedback items may be previously recorded by a recording artist and associated with a primary media item to create an enhanced media item which may purchased by users or subscribers of the digital media content service 76.

Enhanced media items may, depending on the configuration of a media player application, provide for the playback of one or more secondary media items concurrently with at least a portion of a primary media item in order to provide a listen with information about the primary media item using voice feedback, for instance. In other embodiments, secondary media items may constitute system feedback data which are not necessarily associated with a specific primary media item, but may be played back as necessary upon the detection of occurrence of certain system events or states (e.g., low battery warning, user interface sound effect, etc.).

The concurrent playback of primary and secondary media streams on the device 10 may be subject to one or more audio ducking schemes which may be implemented by the audio processing circuitry 62 to improve audio perceptibility of the concurrently played primary and secondary media streams. As mentioned above, the audio ducking techniques may rely on maintaining a relative loudness difference between the primary and secondary media streams based upon loudness values associated with each of the primary and secondary media items. Typically, the primary media item is ducked in order to improve the perceptibility of a secondary media item, such as a voice feedback announcement. However, in some instances in which the primary media item has a relatively low loudness, the secondary media item may be ducked instead in order to maintain the desired relative loudness difference. As will be explained with reference to FIGS. 5A and 5B, the loudness values may be determined using a number of different methods.

Figure 5A:
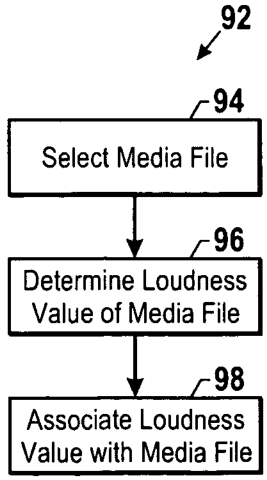
FIG. 5A is a flowchart depicting a method for determining and associating a loudness value with a media file, in accordance with an embodiment of the present technique.

FIG. 5A shows a method 92 for determining the loudness value of a media file. Beginning at step 94, a media file is selected for processing to determine a loudness value. The selected media file may be a primary media file, such as a music file or audiobook, or may be a secondary media file, such as a voice feedback or system feedback announcement. At step 96, the loudness of the selected media file may be determined using any suitable technique, such as root mean square (RMS) analysis, spectral analysis (e.g., using fast Fourier transforms), cepstral processing, or linear prediction. Additionally, loudness values may be determined by analyzing the dynamic range compression (DRC) coefficients of certain encoded audio formats (e.g., ACC, MP3, MP4, etc.) or by using an auditory model. The determined loudness value, which may represent an average loudness value of the media file over its total track length, is subsequently associated with the respective media file, as shown by step 98. For example, the loudness value may be written and/or stored in the metadata of the media file, and may be read from the media file by the audio processing circuitry 62 during playback.

The method 92 may be applied to both primary and secondary media items, and may be implemented on either the handheld device 10, the host device 68, or by the digital media content provider 76. For example, the loudness value of a primary media item may be determined by the host device 68 after being downloaded from the digital media content provider 76. Similarly, loudness values for secondary media items may be determined as the secondary media items are created. Thus, the primary and secondary media items may be transferred to the handheld device 10 with respective loudness values already associated. In other embodiments, the loudness values may be determined by the handheld device. Further, where the secondary media items are system feedback media files, the system feedback files may be pre-loaded on the device 10 by the manufacturer and processed to determine loudness values prior to being sold to an end user. In yet a further embodiment, secondary media items may be assigned a default or pre-selected loudness value such that the loudness values are uniform for all voice feedback data, for all system feedback data, or collectively for both voice and system feedback data.

Figure 5B:
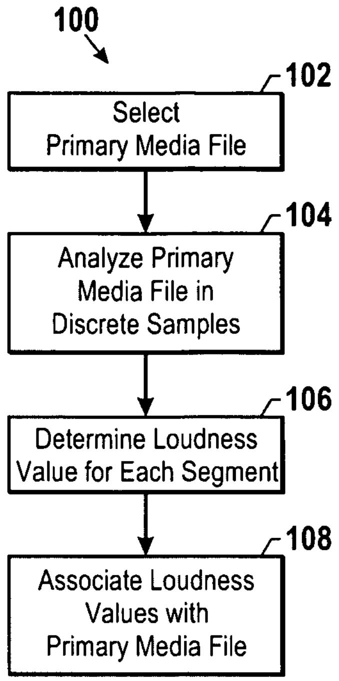
FIG. 5B is a flowchart depicting a method for determining and associating multiple loudness values with a media file, in accordance with an embodiment of the present technique.

As will be appreciated, some music files have varying and contrasting tempos and dynamics that may occur throughout the song. Thus, an average loudness may not always provide an accurate representation of a particular media file at any given track time. Referring to FIG. 5B, a method for assigning multiple loudness values to different segments of a media file is illustrated and referred to by the reference number 100. Beginning at step 102, a media file that is to be processed for multiple loudness values is selected. Generally, the method 100 may be applied to primary media items, such as songs, as their track length is generally substantially longer compared to relatively short voice and system feedback announcements. However, it should be appreciated that the present technique may be applied to any type of media file, regardless of track length.

At step 104, the media file is divided into multiple discrete samples. The length of each sample may be specified by a user, pre-defined by the processing device (e.g., host device 68 or handheld device 10), or selected by the processing device based upon one or more characteristics of the selected media file. By way of example, if the selected media file is a 3 minute song (180,000 ms) and the selected sample length is 250 ms, then 720 samples may be defined within the selected media file. Next, at step 106, one or more of the techniques discussed above (e.g., RMS, spectral, cepstral, linear prediction, etc.) may then be utilized in order to determine a loudness value for each of the samples. For instance, the following table shows one example of how multiple loudness values (measured in decibels) corresponding to the first 3 seconds of the selected media file may appear when analyzed at 250 ms intervals.

TABLE 1

| Loudness values over 3 seconds assessed at 250 ms samples | |
|---|---|
| Time Sample | Loudness Value |
| 0-250 ms | −10 db |
| 251-500 ms | −12 db |
| 501-750 ms | −11 db |
| 751-1000 ms | −8 db |
| 1001-1250 ms | −9 db |
| 1251-1500 ms | −10 db |
| 1501-1750 ms | −14 db |
| 1751-2000 ms | −17 db |
| 2001-2250 ms | −15 db |
| 2251-2500 ms | −20 db |
| 2501-2750 ms | −18 db |
| 2751-3000 ms | −17 db |

Thereafter, at step 108, the multiple loudness values are associated with the selected media file. Thus, where the selected media file is a primary media item, depending on when a voice feedback or system feedback announcement is to be played, audio ducking may be customized based upon the loudness value associated with a particular time sample at which the concurrent playback is requested. Additionally, the multiple loudness values may be used to select the most aesthetically appropriate time at which ducking is initiated. For instance, the audio processing circuitry 62, as will be discussed in further detail below, may initiate a secondary voice or system feedback announcement at a time period during which the least amount of ducking is required to maintain a relative loudness difference.

It should also be understood that the use of the 250 ms samples shown above is intended to provide only one possible sample length, and that the loudness analysis may be performed more or less frequently in other embodiments depending on specific implementation goals and requirements. For instance, as the sampling frequency increases, the amount of additional data required to store loudness values also increases. Thus, in an implementation where conserving storage space (e.g., in the storage device 54) is a concern, the loudness analysis may be performed less frequently, such as at every 1000 ms (1 s). Alternatively, where increased resolution of loudness data is a concern, the loudness analysis may be performed more frequently, for example, at every 50 ms or 100 ms. Still further, certain embodiments may utilize samples that are not necessarily all equal in length.

Figure 6:
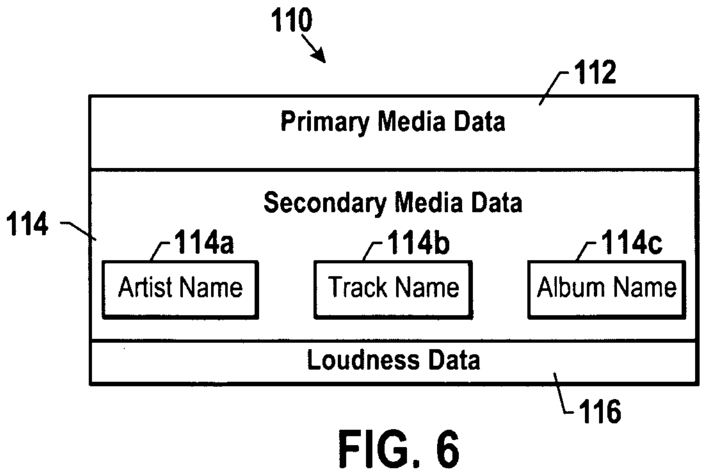
FIG. 6 is a graphical depiction of a primary media file having associated secondary media files and loudness data, in accordance with an embodiment of the present technique.

Referring now to FIG. 6, a schematic representation of an enhanced media item 110 that has been processed for the determination of loudness data is illustrated. The enhanced media item 110 may include primary media data 112 (e.g., a song file, audiobook, etc.) and one or more secondary media items 114. The secondary media items 114 may be created using any of the techniques discussed above with reference to the method 84 shown in FIG. 4. In the illustrated example, the secondary media items 114 may be voice feedback announcements, including an artist name 114*a*, a track name 114*b*, and an album name 114*c*. One or more of these announcements 114*a*, 114*b*, and 114*c*, may be played back as voice feedback in response an event, and may be configured via a set of user preferences or options stored on the device 10. The enhanced media item 110 further includes loudness data 116. The loudness data 116 may include loudness values for each of the primary media item 112 and the secondary media items 114*a*, 114*b*, and 114*c* and may be determined using any of the techniques discussed above with reference to FIGS. 5A and 5B. Although shown separately from the schematic blocks representing the primary (112) and secondary media items (114), it should be understood that the determined primary and secondary loudness values may be associated with their respective files. For example, in one presently contemplated embodiment, respective loudness values may be stored in metadata tags of each primary and secondary media file.

In accordance with a further aspect of the present disclosure, secondary media items may also be created with respect to a defined group of multiple media files. For instance, many media player applications currently permit a user to define the group of media files as a "playlist." Thus, rather than repeatedly queuing each of the media files each time a user wishes to listen to the media files, the user may conveniently select a defined playlist to load the entire group of media files without having to specify the location of each media file.

Figure 7:
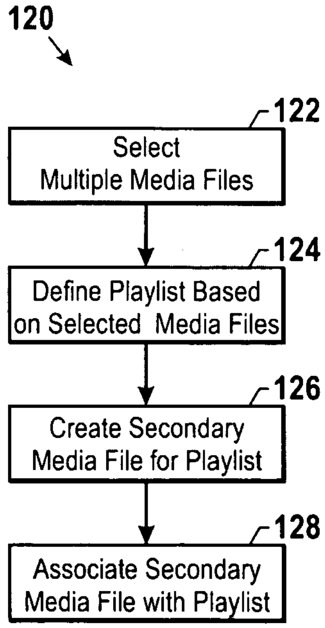
FIG. 7 is a flowchart depicting a method for defining a playlist and creating and associating a secondary media file with the defined playlist, in accordance with an embodiment of the present technique.

FIG. 7 shows a method 120 by which a secondary media item may be created for such a playlist. Beginning at step 122, a plurality of media files that a user wishes to include into a playlist is selected. For example, a the selected plurality of media files may include the user's favorite songs, an entire album by a recording artist, multiple albums by one or more particular recording artists, an audiobook, or some combination thereof. Once the appropriate media files have been selected, the user may save the selected files as a playlist, as indicated at step 124. Generally, the option to save a group of media files as a playlist may be provided by a media player application.

Next, at step 126, a secondary media item may be created for the playlist defined in step 124. The secondary media item may be created based on the name that the user assigned to the playlist and using the voice synthesis or voice recording techniques discussed above. Finally, at step 128, the secondary media item may be associated with the playlist. For example, if the user assigned the name "Favorite Songs" to the defined playlist, a voice synthesis program may create and associate a secondary media item with playlist, such that when the playlist is loaded by the media player application or when a media item from the playlist is initially played, the secondary media item may be played back concurrently and announce the name of the playlist as "Favorite Songs." Having now explained various techniques and embodiments that may be implemented for creating secondary media items that may be associated with primary media items (including playlists), as well as for determining loudness values of such items, the dynamic audio ducking techniques that may be implemented by the audio processing circuitry 62, as briefly mentioned above, will now be described in further detail.

Figure 8:
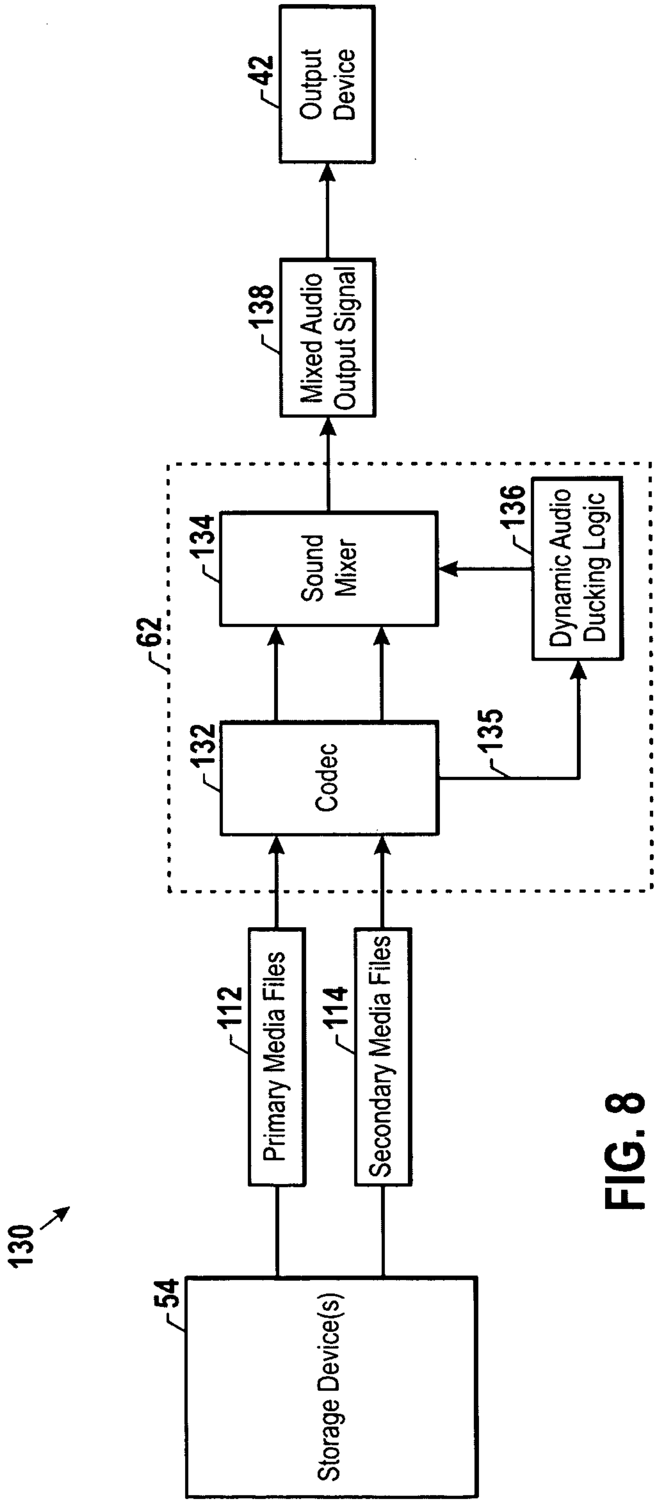
FIG. 8 is a schematic block diagram depicting the concurrent playback of a primary media file and a secondary media file by the electronic device shown in FIG. 1, in accordance with an embodiment of the present technique.

FIG. 8 illustrates a schematic diagram of a process 130 by which a primary 112 and secondary media item 114 may be processed by the audio processing circuitry 62 and concurrently outputted as a mixed audio stream by the device 10. As discussed above, the primary media item 112 and secondary media item 114 may be stored in the storage device 54 and may be retrieved for playback by a media player application, such as iTunes®. As will be appreciated, generally, the secondary media item is retrieved when a particular feedback event requesting the playback of the secondary media item is detected. For instance, a feedback event may be a track change or playlist change that is manually initiated by a user or automatically initiated by a media player application (e.g., upon detecting the end of a primary media track). Additionally, a feedback event may occur on demand by a user. For instance, the media player application may provide a command that the user may select in order to hear voice feedback while a primary media item is playing.

Additionally, where the secondary media item is a system feedback announcement that is not associated with any particular primary media item, a feedback event may be the detection a certain device state or event. For example, if the charge stored by the power source 60 (e.g., battery) of the device 10 drops below a certain threshold, a system feedback announcement may be played concurrently with a current primary media track to inform the user of the state of the device 10. In another example, a system feedback announcement may be a sound effect (e.g., click or beep) associated with a user interface (e.g., GUI 28) and may be played as a user navigates the interface. As will be appreciated, the use of voice and system feedback techniques on the device 10 may be beneficial in providing a user with information about a primary media item or about the state of the device 10. Further, in an embodiment where the device 10 does not include a display and/or graphical interface, a user may rely extensively on voice and system feedback announcements for information about the state of the device 10 and/or primary media items being played back on the device 10. By way of example, a device 10 that lacks a display and graphical user interface may be a model of an iPod Shuffle®, available from Apple Inc.

When a feedback event is detected, the primary 112 and secondary media items 114 may be processed and outputted by the audio processing circuitry 62. It should be understood, however, that the primary media item 112 may have been playing prior to the feedback event, and that the period of concurrent playback does not necessarily have to occur at the beginning of the primary media track. As shown in FIG. 8, the audio processing circuitry 62 may include a coder-decoder component (codec) 132, a mixer 134, and dynamic audio ducking logic 136. The codec 132 may be implemented via hardware and/or software, and may be utilized for decoding certain types of encoded audio formats, such as MP3, AAC or AACPlus, Ogg Vorbis, MP4, MP3Pro, Windows Media Audio, or any suitable format. The respective decoded primary and secondary streams may be received by the mixer 134. The mixer 134 may also be implemented via hardware and/or software, and may perform the function of combining two or more electronic signals (e.g., primary and secondary audio signals) into a composite output signal 138. The composite signal 138 may be output to an output device, such as the audio input/output elements 42.

Generally, the mixer 134 may include a plurality of channel inputs for receiving respective audio streams. Each channel may be manipulated to control one or more aspects of the received audio stream, such as tone, loudness, timbre, or dynamics, to name just a few. The mixing of the primary and secondary audio streams by the mixer 134, primarily with respect to the adjustment of loudness, may be controlled by the dynamic audio ducking logic 136. The dynamic audio ducking logic 136 may include both hardware and/or software components and may be configured to read loudness values and other characteristics of the primary 112 and secondary 114 media data. For example, as represented by the input 135, the dynamic audio ducking logic 136 may read the loudness values associated with primary 112 and secondary 114 media data, respectively, as they are decoded by the codec 132. Further, though shown as being a component of the audio processing circuitry 62 (e.g., stored in dedicated memory, as discussed above) in the present figure, it should be understood that the dynamic audio ducking logic 136 may also be implemented separately, such as in the main memory 52 (e.g., as part of the device firmware) or as an executable program stored in the storage device 54, for example.

In accordance with the presently disclosed techniques, the ducking of an audio stream may be based upon loudness values associated with the primary 112 and secondary 114 media items. Generally, one of primary and secondary audio streams may be ducked so that a desired relative loudness difference between the two streams is generally maintained during the period of concurrent playback. For example, the dynamic audio ducking logic 136 may duck a primary media item in order render a concurrently played voice or system feedback announcement more audible to a listener, and may also reduce or prevent clipping or distortion that may be associated when the combined gain of the unducked concurrent audio streams exceeds the power output threshold of an associated output device 42. Still further, the dynamic audio ducking logic 136 may control the rate and/or the time at which ducking occurs. These and other various audio ducking techniques will be explained in further detail with reference to the method flowcharts and graphical illustrations provided in FIGS. 9-19 below.

Figure 9:
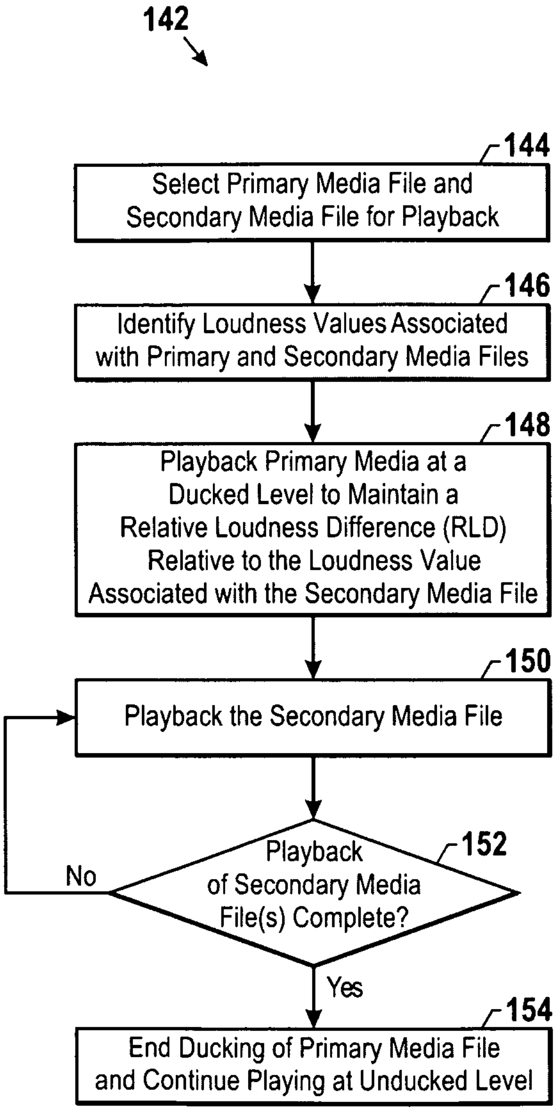
FIG. 9 is a flowchart depicting a method for ducking a primary audio stream in accordance with an embodiment of the present technique.

FIG. 9 illustrates a general process 142 by which an audio ducking scheme may be performed in accordance with the presently disclosed techniques. Beginning with step 144, a primary and secondary media item may be selected for concurrent playback. The primary and secondary media item may be associated portions of an enhanced media item, as discussed above. For instance, the primary media item may represent a music file, and the secondary media item may represent one or more voice feedback announcements. Additionally, the secondary media file may be system feedback announcement that is not associated with the primary media item, but is selected based upon a particular system event detected on the playback device (e.g., handheld device 10).

At step 146, loudness values associated with the primary and secondary media items may be identified. For instance, the respective loudness values may be read from metadata associated with each of the primary and secondary media items. Alternatively, in some embodiments, all media items identified as secondary media items may be assigned a common loudness value. Next, at step 148, the primary media item, based on the loudness values obtained in step 146, is ducked in order to maintain a relative loudness difference with respect to the loudness value of the secondary media item. In one embodiment, the amount of ducking that is required may be expressed by the following equation:

$$D=S-R-P, \qquad \text{(Equation 1)}$$

wherein S represents the loudness value of the secondary media item, wherein P represents the loudness of the primary media item, wherein R represents the desired relative loudness difference, and wherein D represents a ducking amount that is to be applied to the primary media item. By way of example, if the desired relative loudness difference R is 10 and if the loudness values of the primary P and secondary S media items are −11 db and −14 db, respectively, then the amount of ducking D required would be equal to −13 db. That is, the primary media file would need to be ducked to −24 db (−11 db reduced by −13 db) in order to maintain the desired relative loudness difference R of 10. The relative loudness difference R may be pre-defined by the manufacturer and stored by the dynamic audio ducking logic 136. In some embodiments, multiple relative loudness difference values may be defined, and an appropriate value may be selected based upon one or more characteristics of the primary and/or secondary media items.

Next, once the primary media item is ducked to the required loudness level (referred to herein as "ducking in"), the secondary media item may be mixed into the composite audio stream, such that both audio streams are being played back concurrently, as shown at step 150. The ducking of the primary audio stream may continue for the duration in which the secondary audio stream is played. For example, at decision block 152, if it is determined that the playback of the secondary media item is not complete, the process 142 returns to step 150 and continues playing the secondary media item at its normal loudness level and the primary media item at the ducked level (e.g., −24 db).

If the decision step 152 indicates that the playback of the secondary media item is completed, the process 142 proceeds to step 154, wherein the ducking of the primary media item ends (referred to herein as "ducking out"). Thereafter, the primary media file may resume playback at its normal loudness (e.g., unducked loudness of −13 db). The process 142 shown in FIG. 9 is intended to provide a general technique by which the presently disclosed audio ducking schemes may be implemented. It should be understood that the process 142 may be subject to a number of variations and alternative embodiments, as will be discussed below.

Figure 10:
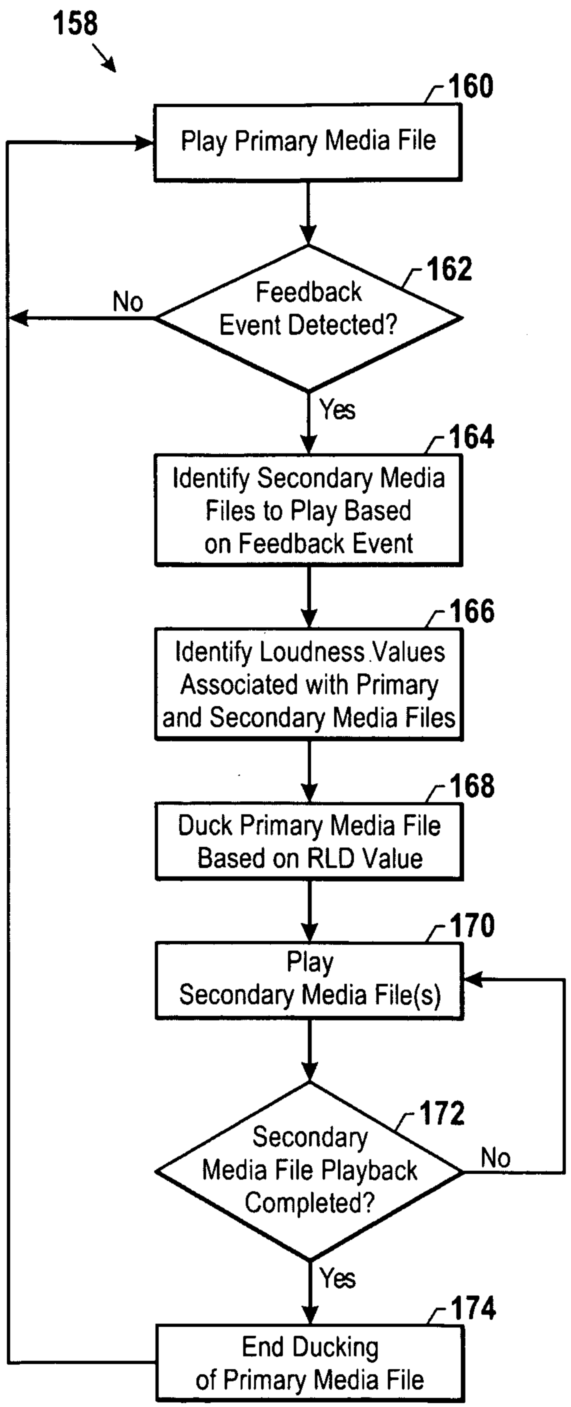
FIG. 10 is a flowchart depicting a method for ducking a primary audio stream in response to a feedback event, in accordance with an embodiment of the present technique.

FIG. 10 depicts an audio ducking process 158 in which a primary media item is ducked during playback in response to a feedback event. Playback of the primary media item may commence at a normal loudness level at step 160. At decision step 162, as long as no feedback event has been detected, the process 158 may remain at step 160. If a feedback event is detected at step 162, the process 158 may continue to step 164, in which one or more appropriate secondary media files are identified and selected for playback. In the presently illustrated embodiment, the feedback event may be any event that triggers the playback of a secondary media item during the playback of the primary media item. For instance, where the primary media item is part of an enhanced media item and the secondary media item constitutes voice feedback data associated with the primary media item, the feedback event may be a manual request by a user of the device 10 to play associated voice feedback information. Alternatively, the secondary media item may be a system feedback announcement, and the feedback event may be a detection of a particular device state that triggers the playback of the system feedback announcement, as discussed above.

At step 166, the loudness values associated with the primary and secondary media items may be identified. As discussed above, the identification of loudness values may be performed by reading the values from metadata associated with each of the primary and secondary media items, or by assigning a common loudness value to a particular type of media file (e.g., secondary media items). In some implementations, loudness values may also be determined on the fly, such as by look-ahead processing of all or a portion of a particular media item.

Next, based upon their respective loudness values, the primary media item may be ducked at step 168 such that a desired relative loudness difference (RLD) is maintained between the primary media item and the secondary media item during the period of concurrent playback. For example, the step of "ducking in," as generally represented by step 168, may include gradually fading the loudness of the primary media item until the loudness reaches the desired ducked level. Once the loudness of the primary media item is reduced to the ducked level (DL), playback of the secondary media item occurs at step 170. For instance, the primary audio stream and the secondary media stream may be mixed by the mixer 134 to create a composite audio stream 138 in which the primary media item is played at the ducked loudness level (DL) and in which the secondary media item is played at its normal loudness. As indicated by the decision block 172, the playback of the secondary media item may continue (step 170) to completion. Once the playback of the secondary media item is completed, ducking of the primary media item ends and the primary media item may be ducked out, wherein the loudness of the primary media item is gradually increased back to its normal level, as shown at step 174.

Figure 11:
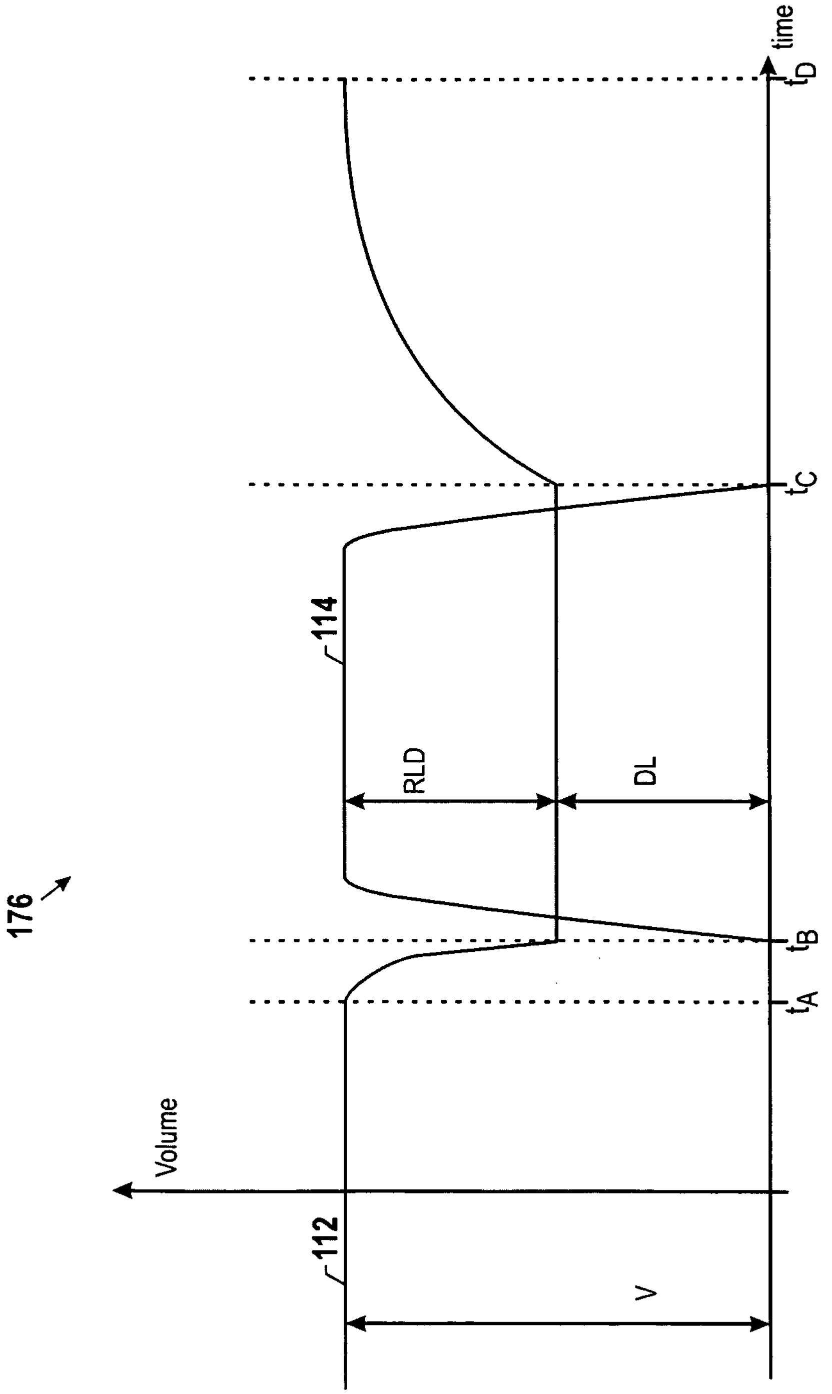
FIG. 11 is a graphical depiction illustrating the ducking of a primary media file based upon the method shown in FIG. 10.

Continuing to FIG. 11, a graphical depiction 176 of an audio ducking scheme that generally corresponds to the process 158 shown in FIG. 10 is illustrated. Initially, a primary media item 112 is played back, such as via a media player application executed on the device 10. As shown, the primary media item 112 is initially played back at a normal loudness, which may correspond to a full volume setting V. As will be appreciated, the volume setting V may be adjusted at will by the user. At time $t_A$, a feedback event may be detected which may trigger the ducking of the primary media item 112. For instance, during the duck-in interval $t_{AB}$ (meaning from time $t_A$ to time $t_B$), the loudness of the primary media item is gradually faded out until its loudness level is reduced to the ducked loudness level DL at time $t_B$, at which point playback of the secondary media item 114 begins.

As shown in the graph 176, the secondary media item 114, which may be either a voice feedback or system feedback announcement, is faded in while the primary media item 112 continues to play at the ducked loudness level DL over the interval $t_{BC}$, which defines the period of concurrent playback. Further, once the secondary media file 114 is fully faded in and reaches the maximum loudness V, the desired relative loudness difference RLD between the primary 112 and secondary 114 media items is achieved. The secondary media item 114 continues to play until it approaches the end of its playback time $t_C$. In the present embodiment, just prior to the time $t_C$, the secondary media item 114 may begin fading out, thus gradually reducing in loudness and eventually concluding playback at time $t_C$. As will be appreciated, the rate at which the secondary media item 114 is faded in and out may be adjusted to provide an aesthetic listening experience. Once playback of the secondary media item ends at time $t_C$, the primary media file 112 is ducked out, whereby the ducked loudness level DL is increased to its previous unducked loudness level over the interval $t_{CD}$. Thus, at time $t_D$, the primary media item 112 resumes playback at full volume (V). In the presently illustrated embodiment, the fade-in and fade-out of the primary and secondary media files is generally non-linear. As will be appreciated, a non-linear increase or decrease of loudness may provide a more aesthetically appealing listening experience.

Figure 12:
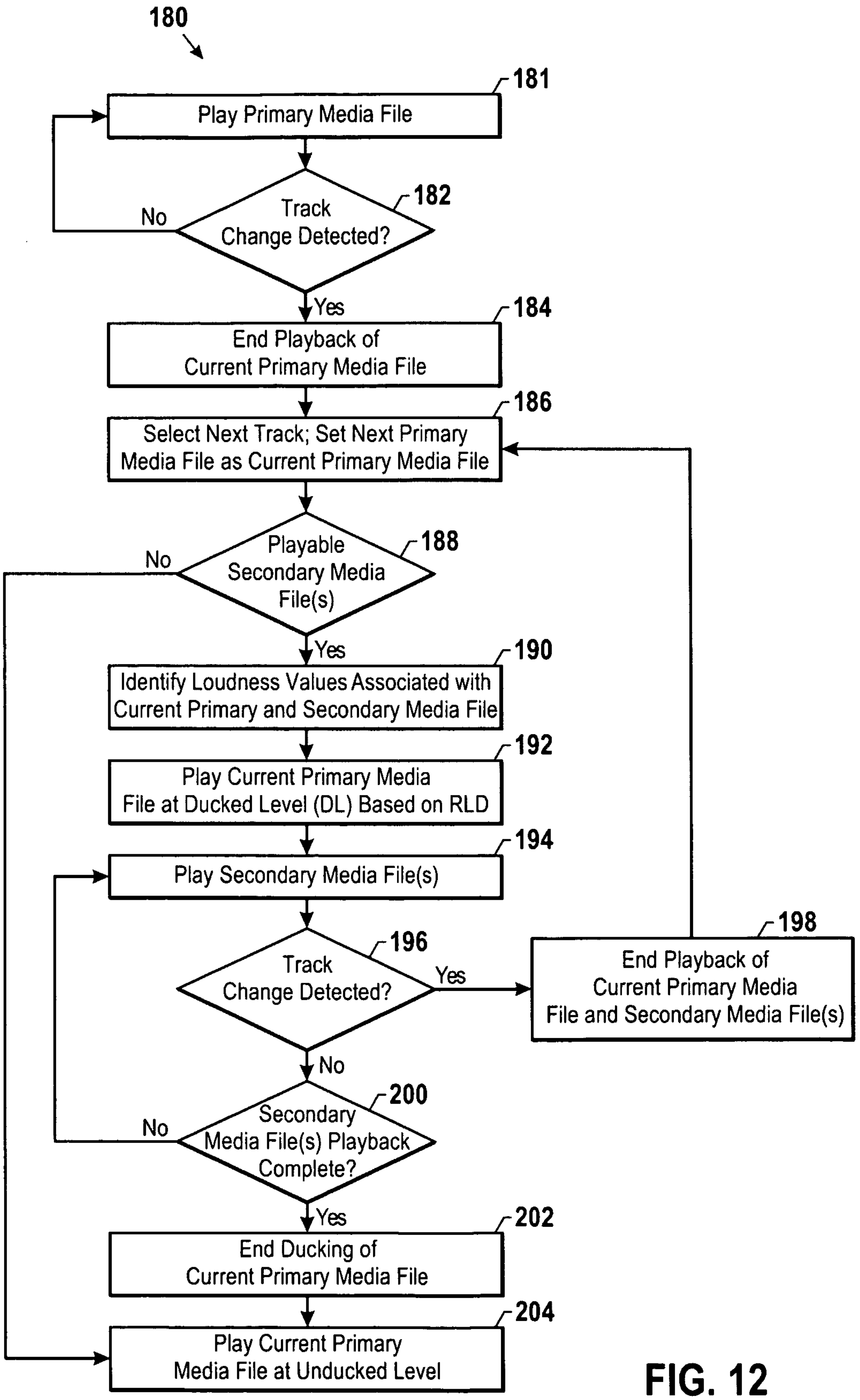
FIG. 12 is a flowchart depicting a method in which a primary audio stream is ducked in response to a track change, in accordance with an embodiment of the present technique.

FIG. 12 illustrates an audio ducking process 180 in which a secondary media item is played concurrently with a primary media item in response to the detection of a track change. Starting with step 181, a current primary media item may be played back by a media player application. As shown by the decision step 182, the playback of the current primary media item may continue until a track change is detected. As will be appreciated, the track change may be initiated manually by a user or automatically by a media player application. For instance, upon detecting the end of a current primary media item, the media player application may automatically proceed to the next primary media item in a playlist.

If a track change is detected at step 182, the process 180 continues to step 184 at which the playback of the current primary media item ends. In some embodiments, the ending the playback may include fading out the current primary media item. Thereafter, at step 186, a subsequent primary media item is selected and becomes the new current primary media item. For instance, the subsequent primary media item may the next track in a playlist or may be a track that is not part of a playlist, but is manually selected by a user.

Continuing to decision step 188, a determination may be made as to whether the current primary media item has associated secondary media. As discussed above, the primary media item may be part of an enhanced media file having secondary media, such as voice feedback announcements associated therewith. If it is determined that the primary media item does not have any associated secondary media items for playback, then the process concludes at step 204, wherein the current primary media item is played back at its normal loudness. That is, no ducking is required when there are no voice feedback announcements. Returning to step 188, if it is determined that the current primary media item has one or more secondary media items available for playback, then the process 180 continues to step 190 at which loudness values for each of the primary and secondary media items are identified. Thereafter, the primary media item is ducked at step 192 to achieve the desired relative loudness difference with respect to the loudness value of the secondary media item, and may be played back by fading in the primary media item to the ducked loudness level (DL).

Once the loudness of the primary media item is increased to the ducked level, the primary media item continues to playback at the ducked loudness level while the playback of the secondary media item at normal loudness begins at step 194. As the concurrent playback period is occurring, the process 180 may continue to monitor for two conditions, represented here by the decision blocks 196 and 200. The decision block 196 determines whether a subsequent track change is detected prior to the completion of the secondary media item playback. For instance, this scenario may occur if a user manually initiates a subsequent track change while the current primary media item and its associated secondary media item or items are being played. If such a track change is detected, the playback of both the primary media item (at a ducked loudness level) and the secondary media item (at a normal loudness level) ends, as indicated by step 198, and the process 180 returns to step 186, wherein a subsequent primary media item is selected and becomes the new current primary media item. The process 180 then continues and repeats steps 188-194.

Returning to step 196, if no track change is detected, the period of concurrent playback continues until a determination is made at step 200 that the playback of the secondary media item has concluded. If the playback of the secondary media item is completed, then the process 180 proceeds from decision step 200 to step 202, at which point the ducking of the primary media item is ended and the primary media item is ducked out. As discussed above, the duck out process may include gradually increasing the loudness of the primary media item from the ducked loudness level until the normal unducked loudness level is reached. Thereafter, the playback of the primary media item continues at the unducked level, thus concluding the process 180 at step 204.

Figure 13:
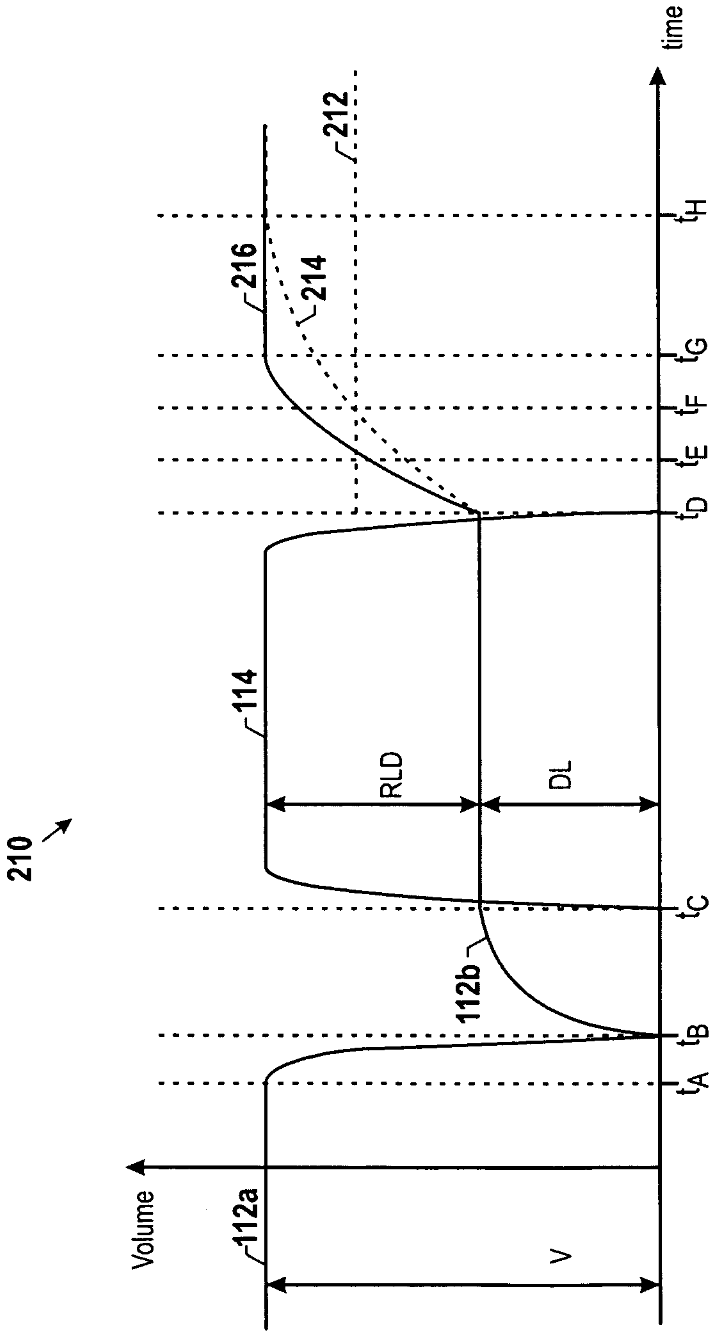
FIG. 13 is a graphical depiction of a technique for ducking a primary audio stream in accordance with the method shown in FIG. 12.

The process 180 shown in FIG. 12 is generally illustrated by the graph 210 illustrated in FIG. 13. As shown, a primary media item 112*a* is played back at normal loudness (volume V) prior to time $t_A$. For instance, the primary media item 112*a* may correspond to the primary media item that is played back at step 181 of the process 180. At time $t_A$, a track change is detected and the primary media item 112*a* is faded out during the interval $t_{AB}$. In one embodiment, the fade out interval $t_{AB}$ may a relatively short period, such as 20-50 ms. A subsequent primary media item 112*b* having an associated secondary media item 114 is selected as the next track. Beginning at time $t_B$, the primary media item 112*b* is gradually faded in to reach a ducked loudness level DL at time $t_C$, at which point the playback of the secondary media item 114 begins. In the illustrated embodiment, the secondary media item 114 is faded in relatively quickly to the normal loudness (V), such that the desired relative loudness difference RLD between the primary stream 112*b* and the secondary stream 114 is maintained during a period of concurrent playback defined by the interval $t_{CD}$.

Once the playback of the secondary media item 114 ends at time $t_D$, the primary media item 112*b* is ducked out. In the presently illustrated example, the rate at which primary media item 112*b* is ducked out may be variable depending on one or more characteristics of the primary media item 112*b*. For instance, if the primary media item 112*b* is a relatively loud song, (e.g., a rock and roll song), the duck out process may be performed more gradually over a longer period, as indicated by the curve 214, to provide a more aesthetically sounding fade in effect as the ducked loudness DL is increased to the normal loudness level (volume V). In the presently illustrated embodiment, the curve 214 represents a duck out period occurring over the interval $t_{DH}$. The loudness level 212 represents a percentage of the total volume V and is meant to help illustrate the non-linear rate at which the loudness level is increased during the duck out period. By way of example, the loudness 212 may represent 70% of the total volume V. Thus, the loudness of the primary media item 112*b* is increased gradually from the ducked level DL to 70% of the volume V over the interval $t_{EF}$. Then, over the interval $t_{FH}$, the loudness of the primary media item 112*b* continues to increase, but less gradually, until the primary media item 112*b* is returned to the full playback volume V at time $t_H$. In the presently illustrated example, the interval $t_{FH}$ is shown as being greater than the interval $t_{DF}$ to illustrate that the loudness of the primary media item 112*b* is increased less aggressively as the loudness nears the full volume V.

Similarly, if the primary media item 112*b* is a song from a "softer" genre (e.g., a jazz or classical song) and having a relatively low loudness, the duck out period may occur more quickly over a shorter interval. For instance, as shown by the curve 216, the duck out period may occur over interval $t_{DG}$ Within the interval $t_{DG}$, the loudness of the primary media item 112*b* may be increased from DL to the level 212 over the interval $t_{DE}$, and may continue to increase over the interval $t_{EG}$, but less aggressively, to reach the full volume V. As will be appreciated, with respect to the curve 216, the intervals $t_{DE}$ and $t_{EG}$ are both shorter than their respective corresponding intervals $t_{DF}$ and $t_{FH}$, as defined by the curve 214, thus illustrating that the rate at which the loudness of the ducked primary media item 112*b* is returned to full volume may be variable and adaptive depending upon one or more characteristics of the primary media item 112*b*.

Figure 14:
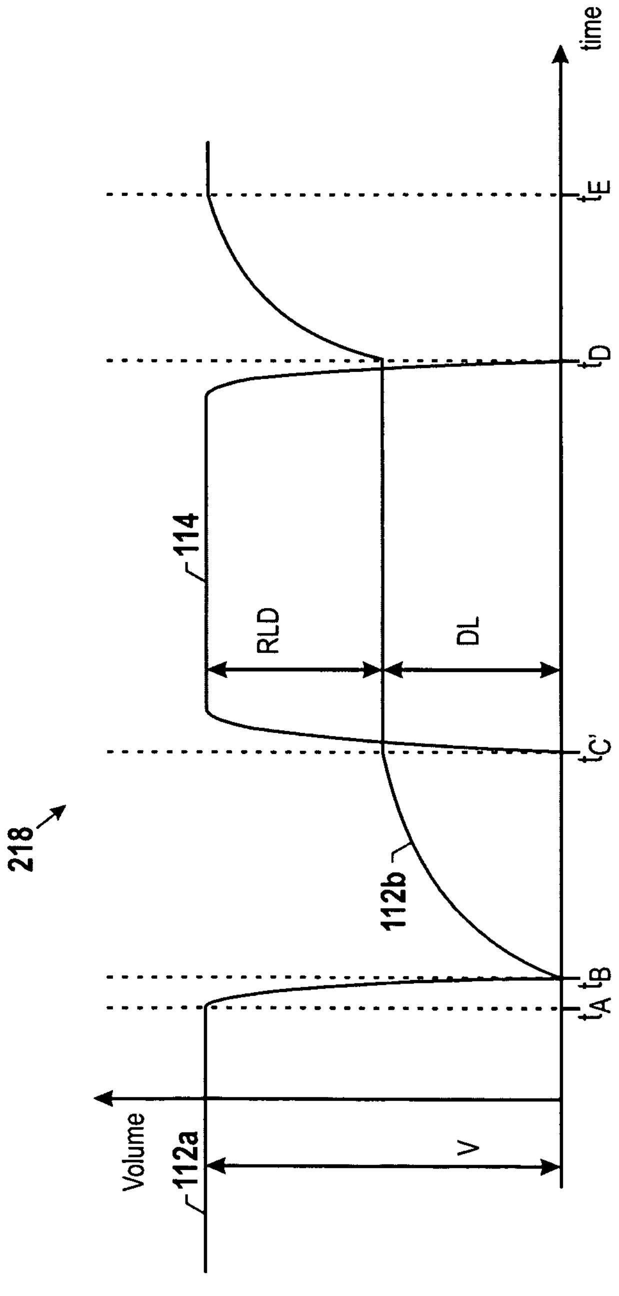
FIG. 14 is a graphical depiction of a technique for ducking a primary audio stream in accordance with the method of FIG. 12, but further illustrating the selection of an optimal time for mixing in a secondary audio stream, in accordance with an embodiment of the present technique.

FIG. 14 shows a graph 218 illustrating a further embodiment of an audio ducking process that is generally performed in accordance with the method 180 shown in FIG. 10, but provides for the adaptive selection of when to begin playback of a secondary media item. In particular, the present technique may be utilized to select a time at which the least amount of ducking is required as the secondary media item is mixed into audio output stream. For example, if the initial notes of the primary media item 112*b* are very loud, the listening experience may be improved by allowing the loud initial notes to subside before mixing in the secondary media item. The presently illustrated technique may be implemented in an embodiment where a primary media item 112*b* has multiple loudness values (e.g., in a lookup table format) associated with respective discrete time samples, as discussed above with reference to FIG. 5B. Accordingly, once a feedback event, such as a track change, is detected at time $t_A$ and the next media item is selected, the audio ducking scheme may perform a "look-ahead" analysis in which the loudness data for a certain future interval is analyzed. For instance, the analysis may determine which data point in the analyzed interval has the lowest loudness value, and thus requires the least amount of ducking when the secondary media stream is mixed into the playback.

To provide an example, assume that a primary media item 112*b* includes the loudness values shown above in Table 1 and that an audio ducking scheme is configured to analyze a future interval of 3 seconds (3000 ms) to select an optimal time for initiating playback of the secondary media item 114. Based on this analysis, the audio ducking scheme may determine that within the 0-3000 ms future interval, the time sample from 2251-2500 ms has the lowest loudness value and is, therefore, the optimal time to initiate playback of the secondary media item 114. Once the optimal time is determined, the primary media item 112*b* may be ducked in, such that the loudness is gradually faded in and increased to the ducked loudness level DL over the interval $t_{BC'}$, which is equivalent to 2251 ms in the present example. At time $t_{C'}$, the ducked level DL for maintaining the desired relative loudness difference is reached and the secondary media item 114 begins playback at full volume V, continuing through the period of concurrent playback within the interval $t_{C'D}$. As discussed above, because time $t_{C'}$ represents the time in which the least amount ducking is required to achieve the desired relative loudness difference, the listening experience may be improved.

As will be appreciated, the optimal time may vary depending on the various parameters of the audio ducking scheme. For instance, referring again to Table 1, if the audio ducking scheme shown in FIG. 14 is only permitted to analyze only a 2 second future interval, then the selected optimal time may correspond to the sample at 1751-2000 ms. In this case, the primary media item 112*b* would be ducked in more quickly. That is, the duck in interval $t_{BC'}$ would be approximately 1751 ms, at which point the primary media item 112*b* reaches the ducked loudness level DL and the secondary media item 114 begins playback and is mixed into the audio stream. It should be appreciated that the future interval in which the audio ducking scheme looks ahead for loudness values may be selected such that any time lag between the feedback event and the playback of the secondary media item is not substantially discernable to a listener.

Figure 15:
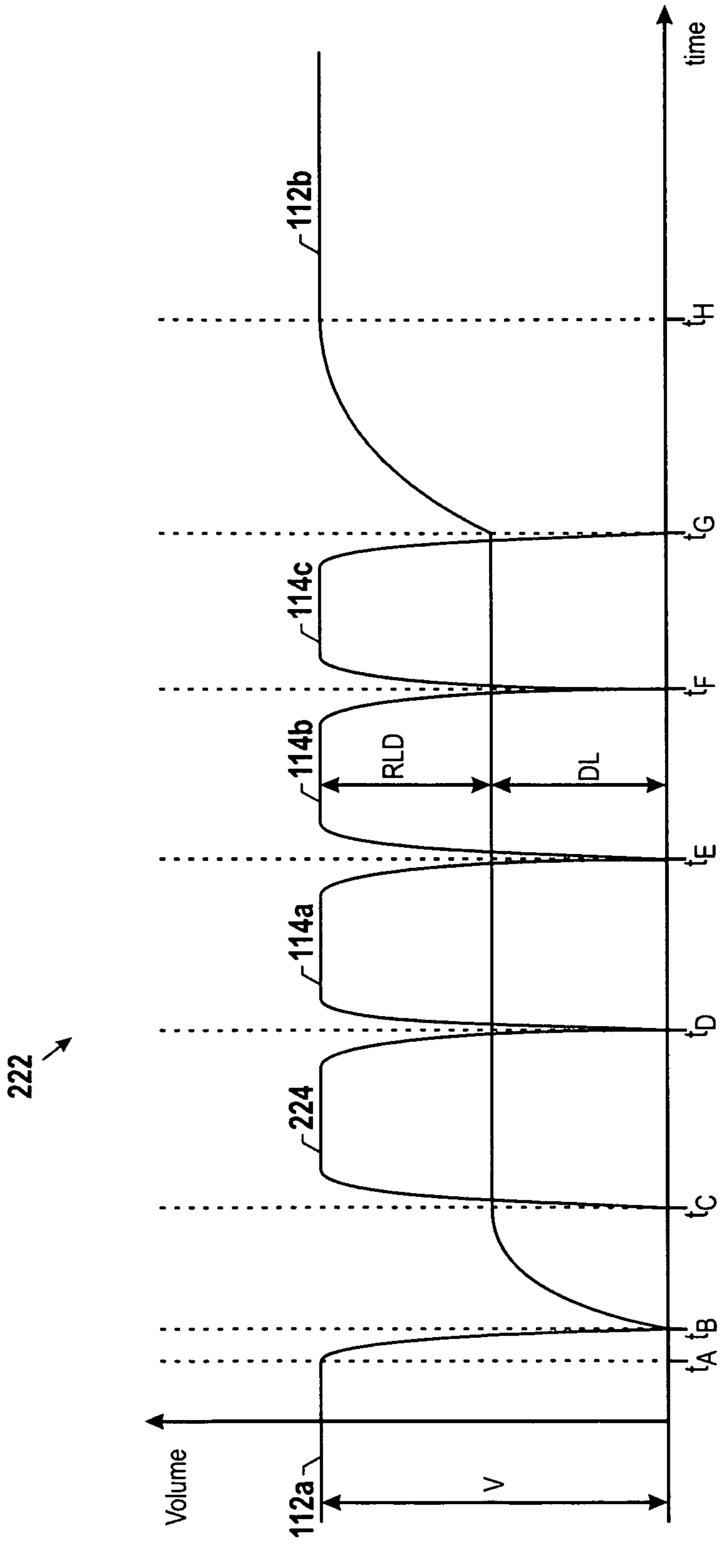
FIG. 15 is a graphical depiction of a technique for ducking a primary audio stream in accordance with the method of FIG. 12, but further illustrating the concurrent playback of multiple secondary media items, in accordance with an embodiment of the present technique.

FIG. 15 shows a graphical depiction 222 of further embodiment of an audio ducking process that is generally performed in accordance with the method 180 of FIG. 10, but illustrates a period of concurrent playback in which multiple secondary media items are played in succession. Upon detecting a feedback event at time $t_A$, which may be a playlist change in the present example, playback of the previous primary media item 112*a* ends and the next primary media item 112*b*, which may be the first track in the next playlist, and its associated secondary media items are identified. In the present example, the secondary media item 224 may represent a playlist voice feedback announcement, while the secondary media items 114*a*, 114*b*, and 114*c* are voice feedback announcements corresponding to an artist name, a track name, and an album name, respectively, as discussed above with reference to FIG. 6.

During the interval $t_{BC}$, the primary media item 112*b* may be ducked in and increased to the ducked loudness DL. Once the ducked level DL is reached, playback of the secondary media items begins over a concurrent playback interval $t_{CG}$, which may be viewed as separate intervals corresponding to each of the secondary media items. For instance, the playlist announcement 224 may occur during the interval $t_{CD}$, the artist announcement 114*a* may occur during the interval $t_{DE}$, the track name announcement 114*b* may occur in the interval $t_{EF}$, and the album name 114*c* announcement may occur in the interval $t_{FG}$. At the conclusion of the announcement 114*c*, the primary media track 112*b* may be ducked out from the ducked level DL and returned to the full volume V over the interval $t_{GH}$.

In the present example, each of the secondary media items 224, 114*a*, 114*b*, and 114*c* are shown as having the same loudness values, such that the primary media item 112*b* is played at a generally constant ducked level DL over the entire concurrent playback period $t_{CG}$ while maintaining the relative loudness difference RLD. In other embodiments, the secondary media items 224, 114*a*, 114*b*, and 114*c* may have different loudness values. In the latter case, the ducked level DL may vary for each interval $t_{CD}$, $t_{DE}$, $t_{EF}$, and $t_{FG}$, so that the relative loudness difference RLD is maintained based upon the respective loudness value of each secondary media item 224, 114*a*, 114*b*, and 114*c*. Moreover, as will be appreciated, the number of secondary media items and the order in which they are played may vary among different implementations and may also be configured by a user, as well be shown in further detail below.

Figure 16:
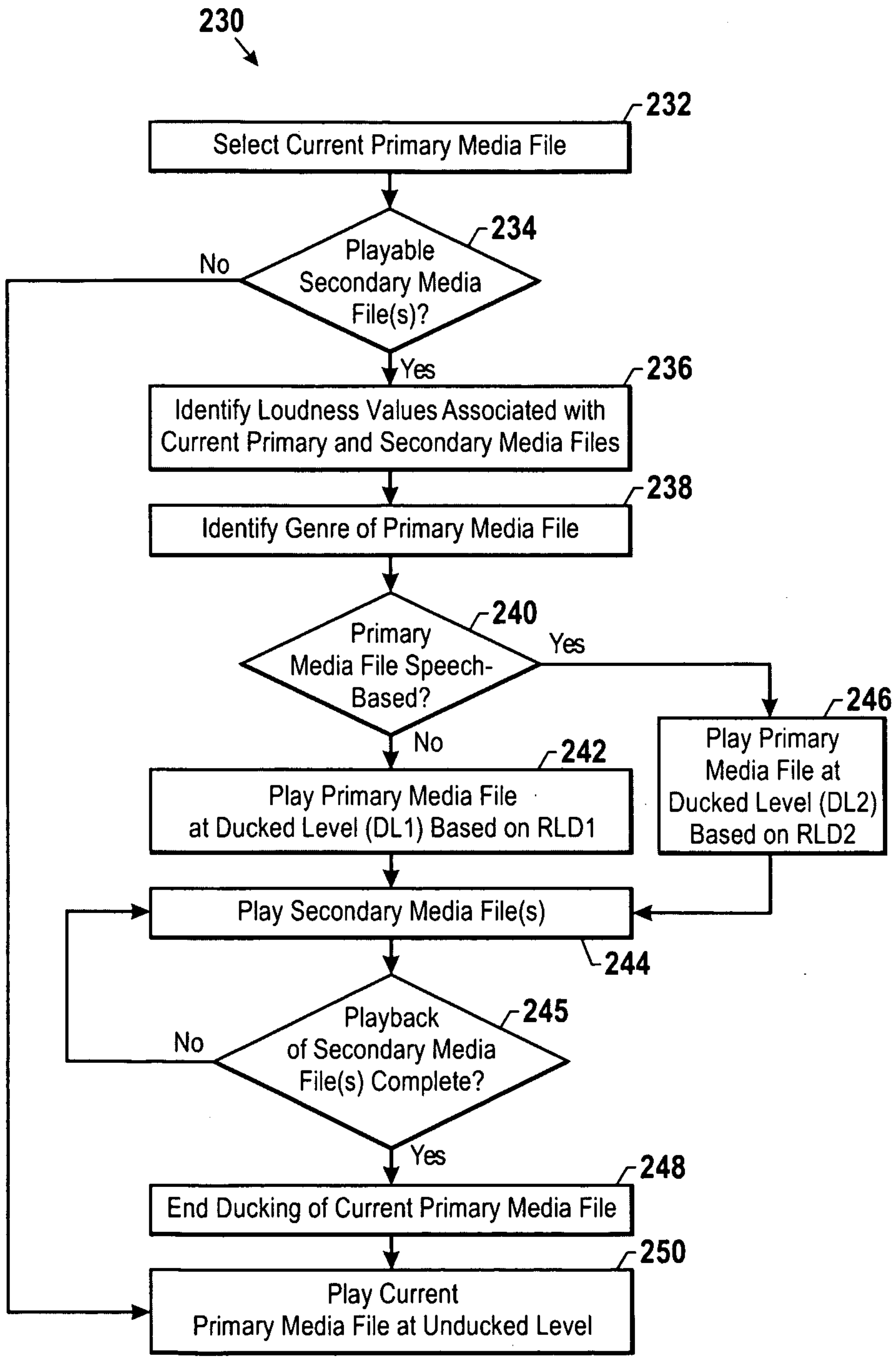
FIG. 16 is a flowchart depicting a method in which the amount of ducking applied to a primary audio stream is selected based upon genre information associated with the primary audio stream.

Continuing now to FIG. 16, an audio ducking process 230 is illustrated in accordance with a further embodiment. The process 230 generally describes an audio ducking technique that may utilize two or more different relative loudness values, which may be selected based upon one or more characteristics of a primary media item. Particularly, the process of 230 may be utilized where the primary media item is primarily a speech-based track, such as an audiobook. As will understood by those skilled in the art, a relative loudness difference that is suitable for ducking a music track while a voice announcement is being spoken may not yield the same audio perceptibility results when applied to a speech-based track due at least partially to frequencies at which spoken words generally occur. Thus, when a primary media track is identified as being primarily speech-based, the process 230 may select a relative loudness difference that results in the speech-based primary media item being ducked more during a voice or system feedback announcement relative to a music-based primary media item.

The process 230 begins at step 232, wherein a primary media item is selected for playback. Thereafter, at decision step 234, a determination is made as to whether the selected primary media item has associated secondary media items. As discussed above, the selected primary media item may be part of an enhanced media file. If there are no secondary media items available, then the process concludes at step 250, whereby the selected primary media item is played back without ducking. If the decision step 234 indicates that secondary media items are available, then the process continues to step 236, in which loudness values for each of the primary and secondary media items are identified (e.g., read from metadata information).

Next, at step 238, the genre of the selected primary media item is determined. In one embodiment, genre information may be stored in metadata tags associated with the primary media item and read by the audio processing circuitry 62. It should be appreciated that in the present example, the genre identification step 238 is primarily concerned with identifying whether the primary media item is of a speech-based genre (e.g., audiobook) or some type of music-based genre. Thus, the exact type of music genre may not necessarily be important in the present example as long as a distinction may be determined between speech-based and music-based files.

In another embodiment, the genre determination step 238 may include performing a frequency analysis on the selected primary media item. For instance, the frequency analysis may include spectral or cepstral analysis techniques, as mentioned above. By way of example, a 44 kilohertz (kHz) audio file may be analyzed in a range from 0-22 kHz (Nyquist frequency) in 1 kHz increments. The analysis may determine at which bands the frequencies are most concentrated. For instance, speech-like tones are generally concentrated in the 0-6 kHz range. Therefore, if the analysis determines that the frequencies are concentrated within a typical speech-like range (e.g., 0-6 kHz), then the primary media item may be identified as a speech-based file. If the analysis determines that the frequencies are more spread out over the entire range, for instance, then the primary media item may be identified as a music-based file.

Next, at decision step 240, if the primary media item is determined to be a music-based file, then the process 230 continues to step 242, wherein the primary media item is ducked to a first ducked level (DL1) to achieve a first relative difference loudness value RLD1 with respect to the loudness value associated with the secondary media item. Thereafter, the secondary media item is played back to completion, as shown by steps 244 and 245. Returning to decision step 240, if the primary media item is identified as a speech-based file, then the process 240 branches to step 246, wherein the primary media item is ducked to a second ducked level (DL2) by a second relative loudness difference value RLD2 with respect to the secondary media item. For example, the value RLD2 may be greater than RLD1, such that a speech-based primary media item is ducked more compared to the amount of ducking that would be applied to a music-based primary media item during the concurrent playback period. As discussed, by increasing the amount of ducking applied to speech-based media items, the audio perceptibility of the secondary media item may be improved from the viewpoint to the user.

Accordingly, depending on whether the primary media item is a speech-based or music-based file, the primary media item may be ducked to maintain either the relative loudness difference RLD1 or RLD2 while the secondary media item is played back at steps 244 and 245. Once playback of the secondary media item is completed, ducking of the primary media item ends at step 248, and the primary media item is returned to its unducked level at step 250. While the present example illustrates the use of two relative loudness difference values RLD1 and RLD2, it should be appreciated that additional relative loudness values may be utilized in other embodiments.

Figure 17:
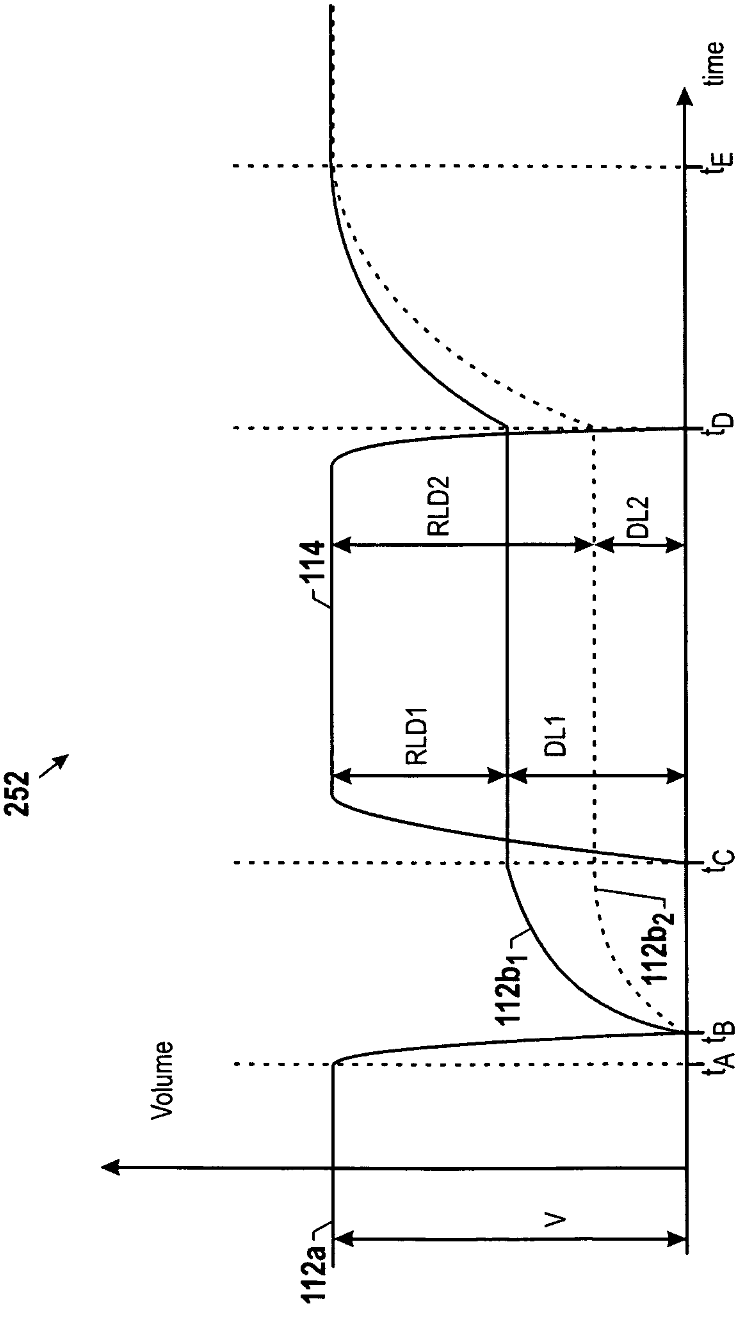
FIG. 17 is a graphical depiction of an audio ducking technique that may be performed in accordance with the method of FIG. 16.

The audio ducking process 230 described in FIG. 16 may be better understood with reference to the graphical depiction 252 illustrated in FIG. 17. As the previous primary media track 112*a* ends at time $t_B$, the next primary media item 112*b* may be analyzed, as discussed above, to determine whether it is generally a speech-based or a music-based track. If the primary media item is determined to be a music-based track, then ducking may occur in accordance with the curve $\mathbf{112}b_1$. As shown, the music-based media item $\mathbf{112}b_1$ is ducked in during the interval $t_{BC}$ until a loudness level of DL1 is obtained. Then, during the concurrent playback interval $t_{CD}$, the secondary media item 114 is played at normal volume V and the music-based media item $\mathbf{112}b_1$ is played at the ducked level DL1, such that the relative loudness difference RLD1 is maintained over the interval $t_{CD}$.

Alternatively, if the primary media item is determined to be a speech-based track, then ducking may be applied in accordance with the curve $\mathbf{112}b_2$. As shown on the graph 252, the speech-based media item $\mathbf{112}b_2$ is ducked in during the interval $t_{BC}$ until a loudness level of DL2, which is lower relative to the value DL1, is obtained. In this manner, a relative loudness difference RLD2, which is greater in magnitude compared to RLD1, is maintained as the secondary media item 114 is played back at normal volume over the concurrent playback interval $t_{CD}$. As such, depending on whether the primary media item 112*b* is a speech-based or music-based file, audio ducking may be optimized to improve the audio perceptibility of the secondary media item 114.

Figure 18:
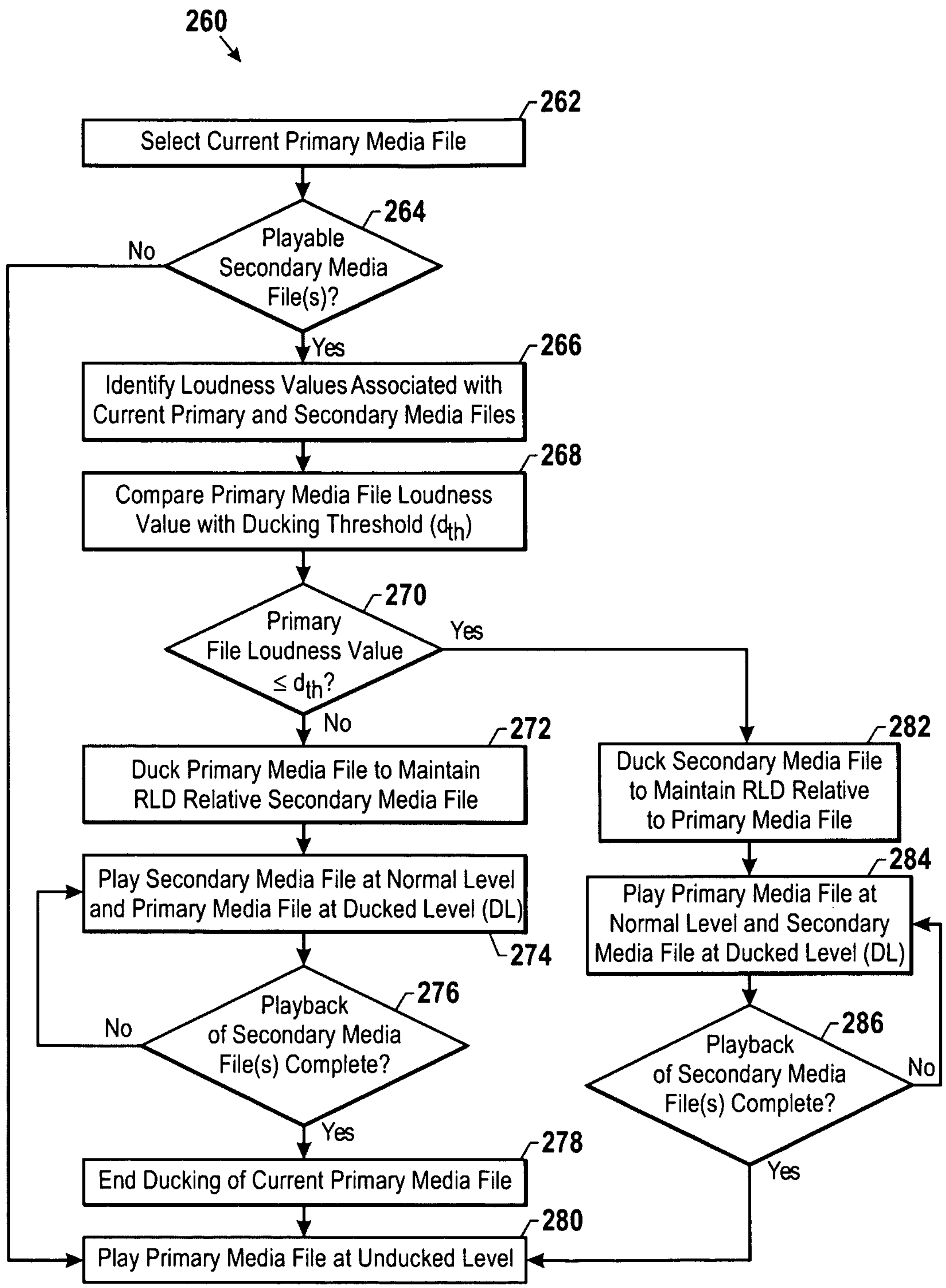
FIG. 18 is a flowchart depicting a method in which audio ducking is applied to either a primary or secondary audio stream based upon the loudness characteristics of the primary audio stream, in accordance with an embodiment of the present technique.

While the above-discussed examples have generally been directed towards applying audio ducking to a primary media item, certain embodiments may also provide for the ducking of a secondary media item. Referring to FIG. 18, an audio ducking process 260 is illustrated in which either the primary or secondary media item may be ducked depending on the loudness characteristic associated with the primary media item. The present technique may be applied in instances where a primary media item has a relatively low loudness value compared to the loudness of a secondary media item, such as a voice feedback item. Further, in some instances, the unducked loudness values of the primary and secondary media items may already meet or even exceed the desired relative loudness difference. In such cases, ducking the primary media item may not be preferable, as doing so may cause the secondary media item to sound "too loud" when perceived by a listener. Thus, the secondary media item may be ducked instead to achieve the relative loudness difference.

Referring to the process 260 and beginning with step 262, a primary media item is selected for playback. Afterwards, at decision step 264, a determination is made as to whether the selected primary media item has associated secondary media items. As discussed above, the selected primary media item may be part of an enhanced media file. If there are no secondary media items available, then the process concludes at step 280, whereby the selected primary media item is played back without ducking. If the decision step 264 indicates that secondary media items are available, then the process continues to step 266, whereby loudness values for each of the primary and secondary media items are identified.

Thereafter, at step 268, the loudness value associated with the primary media track may be compared to a ducking threshold value $d_{th}$. Subsequently, at decision block 270, a determination is made as to whether the primary media loudness value is greater than or less than $d_{th}$. If the primary media loudness value is greater than $d_{th}$, the process 260 continues to step 272, wherein the primary media item is ducked to maintain a desired relative loudness difference with respect to the secondary media item. The secondary media item is then played at full volume to completion, as indicated by steps 274 and 276, while the primary media item is concurrently played back at the ducked level (DL). Once the playback of the secondary media item has finished, the ducking of the primary media item ends, and the primary media item is returned to full volume, as shown at step 278. Thereafter, at step 280, the primary media item continues to play at full volume.

Returning to the decision step 270, if the primary media loudness value is less than or equal to $d_{th}$, the process 260 may branch to step 282. Here, because the loudness of the primary media item is already relatively low, the secondary media item may be ducked instead to achieve the desired relative loudness difference RLD. The secondary media item is then played at the ducked level to completion, as indicated by steps 284 and 286, while the primary media item is concurrently played back at its normal unducked level. Once playback of the ducked secondary media item is completed, the process 260 concludes at step 280, wherein the primary media item continues playing at the unducked level.

Figure 19:
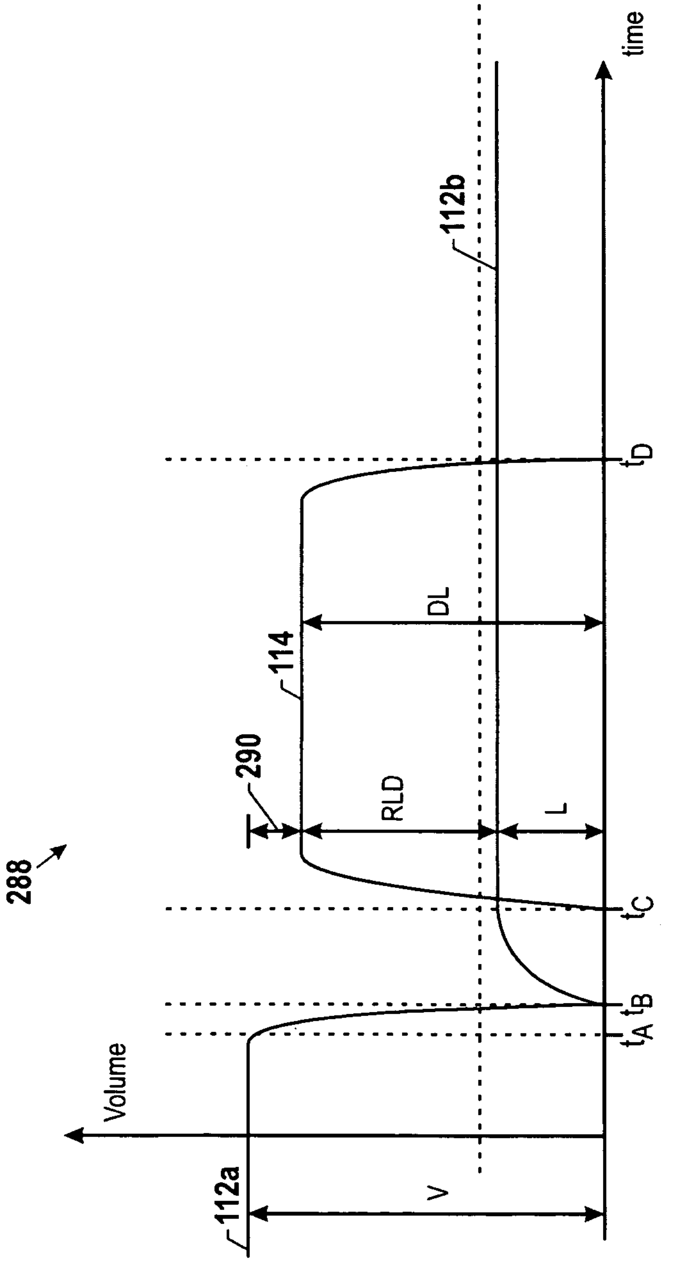
FIG. 19 is a graphical depiction of an audio ducking technique that may be performed in accordance with the method of FIG. 18.

The audio ducking process 260 described in FIG. 18 may be better understood with reference to the graphical representation 288 illustrated in FIG. 19, which shows the ducking of a secondary media item 114. As discussed above, at the conclusion of the previous primary media (time $t_B$) track 112*a*, a subsequent primary media track 112*b* is selected for playback. In the present example, the loudness value L associated with the primary media track 112*b* is less than the ducking threshold $d_{th}$. Thus, instead of ducking the primary media track 112*b*, the secondary media item 114 is ducked instead. As shown in the graph 288, the secondary media item 114 is played back at a ducked loudness level DL, which represents the full volume V reduced by the ducked amount, referred to by the reference number 290. Thus, during the period of concurrent playback from time $t_C$ to time $t_D$, the relative loudness difference RLD is maintained between the primary media item 112*b* and the secondary media item 114. As the secondary media item 114 ends at time $t_D$, playback of the primary media item 112*b* continues at its normal loudness level L.

The various audio ducking techniques described above with reference to FIGS. 9-19 are provided herein by way of example only. Accordingly, it should be understood that the present disclosure should not be construed as being limited to only the examples provided above. Indeed, a number of variations of the audio ducking techniques set forth above may exist. Additionally, various aspects of the individually described techniques may be combined in certain implementations. Further, it should be appreciated that the above-discussed audio ducking schemes may be implemented in any suitable manner. For instance, the audio ducking schemes may be integrated as part of the dynamic audio ducking logic 136 within the audio processing circuitry 62. The dynamic audio ducking logic 136 may be implemented fully in software, such as via a computer program including executable code stored on one or more tangible computer readable medium, or via a combination of both hardware or software elements.

Figure 20:
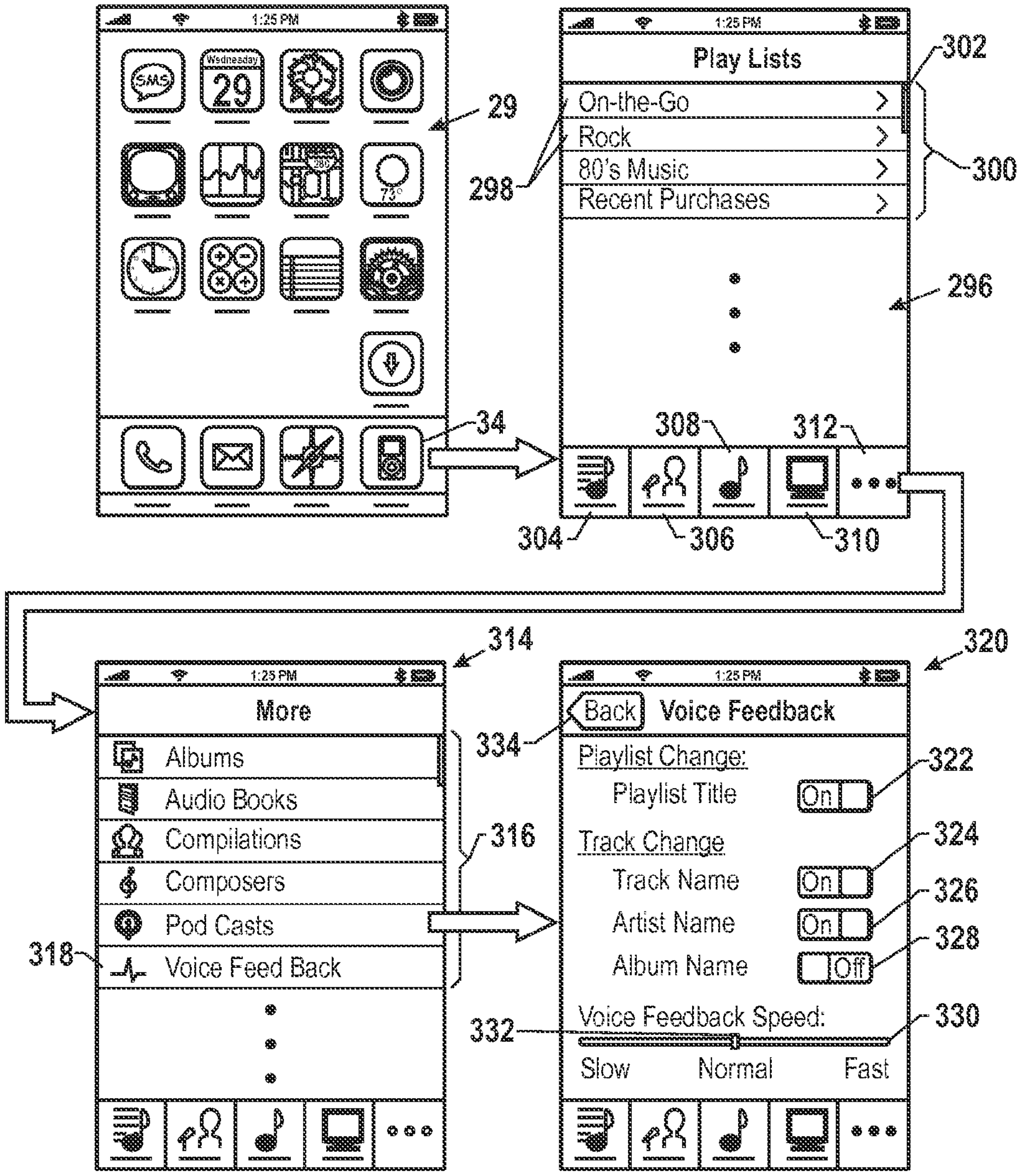
FIG. 20 shows a plurality of screen images that may be displayed on the device of FIG. 1 illustrating various user-configurable options relating to the playback of secondary media files in accordance with an embodiment of the present technique.
Figure 21:
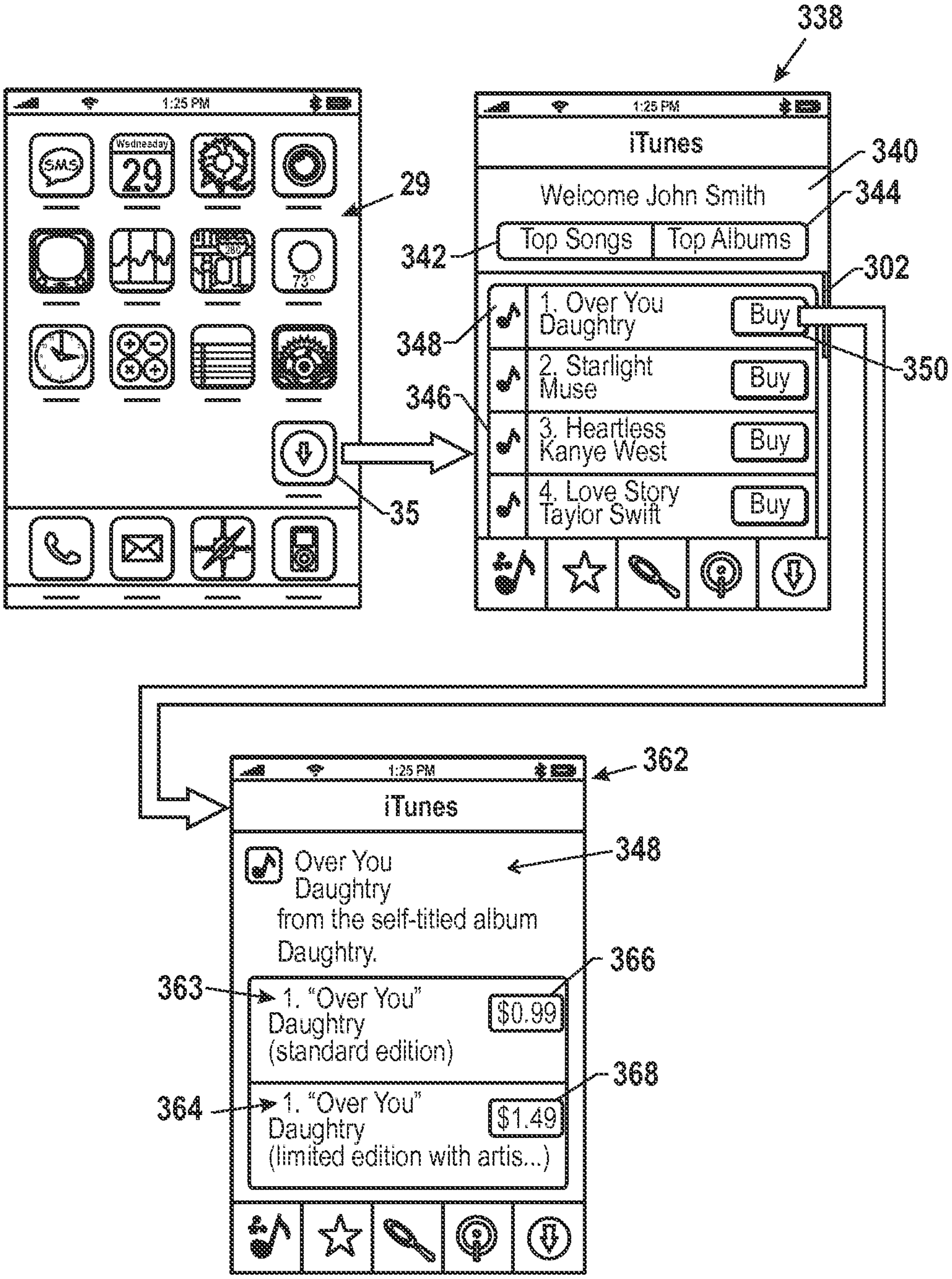
FIG. 21 shows a plurality of screens illustrating how the electronic device shown in FIG. 1 may communicate to an online digital media content provider for the purchase of media files having pre-associated secondary media files, in accordance with an embodiment of the present technique.

Continuing now to FIGS. 20 and 21, several exemplary user interface techniques pertaining to the audio ducking techniques described above are illustrated by way of a plurality of screen images that may be displayed on the device 10. In particular, FIG. 20 illustrates how a user of the device 10 may configure and customize the type of voice feedback announcements that are played back on the device 10. FIG. 21 illustrates how a user of the device 10 may access the digital media content provider 76 to purchase enhanced or non-enhanced media items. As will be understood, the depicted screen images may be generated by the GUI 28 and displayed on the display 24 of the device 10. For instance, these screen images may be generated as the user interacts with the device 10, such as via the input structures 14, 16, 18, 20, and 22, and/or a touch screen interface.

As discussed above, the GUI 28, depending on the inputs and selections made by a user, may display various screens including icons (e.g., 30) and graphical elements. These elements may represent graphical and virtual elements or "buttons" which may be selected by the user from the display 24. Accordingly, it should be understood that the term "button," "virtual button," "graphical button," "graphical elements," or the like, as used in the following description of screen images below, is meant to refer to the graphical representations of buttons or icons represented by the graphical elements provided on the display 24. Further, it should also be understood that the functionalities set forth and described in the subsequent figures may be achieved using a wide variety graphical elements and visual schemes. Therefore, the present invention is not intended to be limited to the precise user interface conventions depicted herein. Rather, embodiments of the present invention may include a wide variety of user interface styles.

Referring first to FIG. 20, a plurality of screen images depicting how voice feedback options may be configured using a media player application running on the device 10 is illustrated. For instance, beginning from the home screen 29 of the GUI 28, the user may initiate the media player application by selecting the graphical button 34. By way of example, the media player application 34 may be an iPod® application running on a model of an iPod Touch® or an iPhone®, available from Apple Inc. Upon selection of the graphical button 34, the user may be navigated to a home screen 296 of the media player application. As shown in FIG. 20, the screen 296 may initially display a listing 300 of playlists 298. As discussed above, a playlist 298 may include a plurality of media files defined by the user. For instance, a playlist 298 may constitute all the song files from an entire music album. Additionally, a playlist may be a custom "mix" of media files chosen by the user of the device 10. As shown here, the screen 296 may include a scroll bar element 302, which may allow a user to navigate the entire listing 300 if the size of display 24 is insufficient to display the listing 300 in its entirety.

The screen 296 also includes the graphical buttons 304, 306, 308, 310, and 312, each of which may correspond to specific functions. For example, if the user navigates away from the screen 296, the selection of the graphical button 304 may return the user to the screen 296 and display the listing 300 of the playlists 298. The graphical button 306 may organize the media files stored on the device 10 by a listing of artists associated with each media file. The graphical button 308 may represent a function by which the media files corresponding specifically to music (e.g., song files) may be sorted and displayed on the device 10. For instance, the selection of the graphical button 308 may display all music files stored on the device alphabetically in a listing that may be navigated by the user. Additionally, the graphical button 310 may represent a function by which the user may access video files stored on the device. Finally, the graphical button 312 may provide the user with a listing of options that the user may configure to customize the functionality of the device 10 and the media player application 34. As shown in the present figure, the selection of the graphical button 312 may navigate the user to the screen 314. The screen 314 may display a listing 316 of various additional configurable options. Particularly, the listing 316 includes an option 318 for configuring voice feedback settings. Thus, by selecting the graphical element 318 from the listing 316, the user may be navigated to the screen 320.

The screen 320 generally displays a number of configurable options with respect to the playback of voice feedback data via the media player application. As shown in the present figure, each voice feedback option is associated with a respective graphical switching element 322, 324, 326, and 328. For instance, the graphical switching element 322 may allow the user to enable or disable playlist announcements. Similarly, the graphical switching elements 324, 326, and 328 may allow the user to enable or disable track name announcements, artist name announcements, and album name announcements, respectively. For instance, in the present screen 320, the graphical switching elements 324, 326, and 328 are in the "ON" position, while the graphical switching element 328, which corresponds to the album name announcement option, is switched to the "OFF" position. Thus, based on the present configuration, the media player application will announce playlist names, track names, and artist names, but not album names.

The screen 320 further includes a graphical scale 330 which a user may adjust to vary the rate at which the voice feedback data is played. In the present embodiment, the playback rate of the voice feedback data may be increased by sliding the graphical element 332 to the right side of the scale 330, and may be decreased by sliding the graphical element 332 to the left side of the scale 330. Thus, the rate at which voice feedback is played may be customized to a user's liking. By way of example, visually impaired (e.g., blind) users may prefer to have voice feedback played at a faster rate than non-visually impaired users. Finally, the screen 320 includes the graphical button 334 by which the user may select to return to the previous screen 314.

Referring now to FIG. 21, a plurality of screen images depicting a process by which a user may purchase enhanced or non-enhanced digital media using the device 10 is illustrated. Beginning from the home screen 29 of the device 10, the user may select the graphical icon 35 from the home screen 29 of the GUI 28 displayed on the device 10 in order to connect to the digital media content provider 76. Once connected, the screen 338 may be displayed on the device 10. As mentioned above, in one implementation, the digital media content provider 76 may be the iTunes® music service, offered by Apple Inc.

The screen 338 may essentially provide a "home" or "main" screen for a virtual store interface initiated via the graphical icon 35 by which the user may browse or search for specific media files that the user wishes to purchase from the digital media content provider 76. As shown here, the screen 338 may display a message 340 confirming the identity of the user, for example, based on the account information provided during the login process. The screen 338 may also display the graphical buttons 342 and 344. The graphical button 342 may be initially selected by default and may display a listing 346 of music files on the screen 338. By way of example, the music files 346 displayed on the screen 338 may correspond to the current most popular music files. Essentially, the listing of the music files 346 on the screen 338 may serve to provide recommendations for various music files which the user may select for purchase. Each of the listed music files may have a graphical button associated therewith. For instance, the music file 348 may be associated with the graphical button 350. Accordingly, if the user wishes to purchase the music file 348, the purchase process may be initiated by selecting the graphical button 350.

The screen 338 may further display a scroll bar element 302 to provide a scrolling function. Thus, where the listing of the music files 346 exceeds the display capabilities of the device 10, the user may interface with the scroll bar element 302 in order to navigate the remainder of the listing. Alternatively, the user may also choose to view media files arranged in groups, such as by music albums, by selecting the graphical button 344. As will be appreciated, an album may contain multiple music files which, in some instances, may be authored or recorded by the same artist, and may be provided as a package of media files that the user may select for purchase in a single transaction.

Upon selecting the graphical button 350, a purchase process may be initiated and the user may be navigated to the screen 362. The screen 362 displays a listing of available products associated with the selected music file 348. For instance, digital media content provider 76 may offer a non-enhanced version 363 of the selected song and an enhanced version 364 of the selected song which includes pre-associated secondary voice feedback recorded by the artist. The user may select the graphical buttons 366 and 368 to purchase the non-enhanced 363 and enhanced 364 versions of the song, respectively. In the present example, the enhanced version 364 may be priced higher than the non-enhanced version. Further, it should be understood that the user may purchase the cheaper non-enhanced version 363 of the song, and convert it to an enhanced version locally on the device 10 (or through a host device 68) using the voice synthesis or recording techniques discussed above.

While the above-illustrated screen images have been primarily discussed as being displayed on the device 10, it should be understood that similar screen images may also be displayed on the host device 68. That is, the host device 68 may also be configured to execute a similar media player application and connect to the digital media content provider 76 to purchase and download digital media.

While the present invention may be susceptible to various modifications and alternative forms, specific embodiments have been shown by way of example in the drawings and will be described in detail herein. However, it should be understood that the techniques set forth in the present disclosure are not intended to be limited to the particular forms disclosed. Rather, the invention is to cover all modifications, equivalents and alternatives falling within the spirit and scope of the disclosure as defined by the following appended claims.

What is claimed is:

1. A method, comprising:

selecting a primary media item for playback on an electronic device;

selecting a secondary media item for playback on the electronic device; and ducking the primary media item by a ducking value while the second media item is played based upon a desired relative loudness difference, such that the relative loudness difference is substantially maintained and such that the primary media item is played at a ducked loudness level during an interval of concurrent playback in which the primary and secondary media items are both played back simultaneously on the electronic device, wherein the primary media item is associated with a plurality of loudness values corresponding to a plurality of respective discrete time samples of the primary media item, and wherein the time at which the concurrent playback interval begins is determined based on a time sample corresponding to the selection of an optimal loudness value from the plurality of loudness values.

2. The method of claim 1, wherein the ducking value is determined based at least partially upon the desired relative loudness difference, a loudness value associated with the primary media item, and a loudness value associated with the secondary media item.

3. The method of claim 2, wherein the loudness values associated with the primary and secondary media items are read from metadata information associated with the primary and secondary media item, respectively.

4. The method of claim 2, wherein the loudness values associated with the primary or the secondary media items are determined using RMS analysis, spectral analysis, cepstral analysis, linear prediction, analysis of dynamic range compression coefficients, an auditory model, or some combination thereof, prior to playback on the electronic device.

5. The method of claim 1, wherein selecting the optimal loudness value comprises:

analyzing a portion of the plurality of discrete time samples based on a defined future interval; and selecting a loudness value within the future interval that minimizes the ducking value, wherein the time sample corresponding to the selected loudness value is used to determine the time at which the concurrent playback interval begins.

6. The method of claim 1, wherein ducking the primary media item comprises:

ducking in the primary media item prior to the concurrent playback interval; and ducking out the primary media item following the concurrent playback interval.

7. The method of claim 6, wherein ducking in the primary media item comprises either fading out the primary media item to the ducked loudness level if the primary media item is currently in the process of being played back on the electronic device, or fading in the primary media item to the ducked loudness level if playback of the primary media item has not begun playback.

8. The method of claim 6, wherein ducking in and ducking out the primary media item is performed non-linearly.

9. The method of claim 6, wherein the rate at which the primary media item is ducked in and ducked out is variable depending on one or more characteristics of the primary media item.

10. The method of claim 1, wherein the secondary media item is a voice feedback announcement associated with the primary media item, and wherein the primary and secondary media item collectively comprise an enhanced media item.

11. The method of claim 1, wherein secondary media item is a system feedback announcement that is not associated with a particular media item, and wherein the interval of concurrent playback is initiated in response to the occurrence of a system event.

12. The method of claim 1, wherein ducking the primary media item comprises:

determining the genre of the primary media item; and if the genre of the primary media file is substantially music data, ducking the primary media item based upon a first relative loudness difference, such that the first relative loudness difference is substantially maintained during an interval of concurrent playback, or else, if the genre of the primary media item is substantially speech data, ducking the primary media item based upon a second relative loudness difference, such that the second relative loudness difference is substantially maintained during the interval of concurrent playback, wherein the second relative loudness difference is greater than the first relative loudness difference.

13. The method of claim 12, wherein determining the genre of the primary media item comprises reading the genre information from metadata associated with the primary media item.

14. The method of claim 12, wherein determining the genre of the primary media item comprises using frequency analysis to determine the frequencies at which the audio data of the primary media item is most concentrated.

15. The method of claim 14, wherein the genre of the primary media item is determined to be substantially speech data if the audio data is generally concentrated within a frequency range of 1000-6000 hertz.

16. The method of claim 14, wherein determining the frequency analysis comprises spectral or cepstral analysis, or some combination thereof.

17. One or more tangible, non-transitory computer-readable storage media having instructions encoded thereon for execution by a processor, the instructions comprising:

a routine for selecting a primary media item for playback on an electronic device, the primary media item having an associated loudness value;

a routine for selecting a secondary media item for playback on the electronic device;

a routine for comparing the loudness value of the primary media item to a ducking threshold value; and a routine for ducking one of the primary and secondary media items based upon the comparison, such that a desired relative loudness difference is substantially maintained during an interval of concurrent playback, wherein ducking one of the primary and secondary media items comprises ducking the primary media item if the loudness value is greater than the ducking threshold value, or else ducking the secondary media item if the loudness value is less than the ducking threshold value.

18. The one or more tangible, non-transitory computer-readable storage media of claim 17, wherein ducking the secondary media item comprises reducing the loudness level of the secondary media item while the primary media item is played at its associated loudness level during the concurrent playback interval.

19. An electronic device, comprising:

a processor;

a storage device configured to store a plurality of media items and their associated loudness values;

a memory device communicatively coupled to the processor and configured to store a media player application executable by the processor, wherein the media player application is configured to provide for the playback of one or more of the plurality of media items;

an audio processing circuit comprising:

a mixer configured to mix a plurality of audio input streams during an interval of concurrent playback to produce a composite mixed audio output stream, wherein the plurality of audio input streams includes a primary audio stream corresponding to a primary media item and a secondary audio stream corresponding to a secondary media item; and audio ducking logic configured to duck the primary audio stream by a determined ducking value while the second media item played based upon a desired relative loudness difference, such that the relative loudness difference is substantially maintained during the concurrent playback interval, wherein the primary media item is associated with a plurality of loudness values corresponding to a plurality of respective discrete time samples of the primary media item, and wherein the audio ducking logic is configured to select an optimal time at which the concurrent playback interval begins by selecting an optimal loudness value from the plurality of loudness values; and an audio output device configured to output the composite audio stream.

20. The electronic device of claim 19, wherein the ducking value is determined based at least partially upon the desired relative loudness difference, a loudness value associated with the primary media item, and a loudness value associated with the secondary media item.

21. The electronic device of claim 19, wherein the audio ducking logic is configured to read the loudness values from metadata associated with the primary and secondary media items.

22. The electronic device of claim 20, wherein the loudness values associated with the primary or the secondary media items are determined using RMS analysis, spectral analysis, cepstral analysis, linear prediction, analysis of dynamic range compression coefficients, an auditory model, or some combination thereof, prior to playback on the electronic device, and to associate the determined loudness values with the respective primary or secondary media item.

23. The electronic device of claim 22, comprising a network interface or a data interface, wherein the loudness are determined on an external device and received by the electronic device using either the network or data interface.

24. The electronic device of claim 20, wherein the audio ducking logic is configured to select the desired relative loudness difference is selected from first and second relative loudness difference values, and wherein the selection of the first or second relative loudness difference value is based at least partially upon genre information corresponding to the primary media item.

25. The electronic device of claim 24, wherein the audio ducking logic is configured to duck the primary media item based upon the first relative loudness difference if the genre of the primary media file is substantially music data, such that the first relative loudness difference is substantially maintained during the interval of concurrent playback, and to duck the primary media item based upon the second relative loudness difference if the genre of the primary media item is substantially speech data, such that the second relative loudness difference is substantially maintained during the interval of concurrent playback, and wherein the second relative loudness difference is greater than the first relative loudness difference.

26. The electronic device of claim 24, wherein the genre of the primary media item is determined by reading genre information from metadata associated with the primary media item.

27. The electronic device of claim 24, wherein in determining the genre of the primary media item, the audio processing circuit is configured to perform frequency analysis to determine the frequencies at which the audio data of the primary media item is most concentrated.

28. The electronic device of claim 27, wherein the genre of the primary media item is determined to be speech data if the audio data is generally concentrated within a frequency range from 1000-6000 hertz.

29. The electronic device of claim 19, wherein the audio ducking logic, in selecting the optimal loudness value, is configured to analyze a portion of the plurality of discrete time samples based on a defined future interval and to select a loudness value within the future interval that minimizes the ducking value, wherein the time sample corresponding to the selected loudness value is used by the audio ducking logic to determine the optimal time.

30. The electronic device of claim 19, wherein the primary media item comprises a music file, an audiobook, or a podcast, or some combination thereof, and wherein the secondary media item comprises a voice feedback announcement or a system feedback announcement.

31. The electronic device of claim 19, comprising a display device configured to display a graphical user interface associated with the media player application.

32. The electronic device of claim 31, wherein the user interface provides a user of the electronic device access to a plurality of configurable secondary media playback options.

33. The electronic device of claim 32, wherein the configurable secondary media playback options comprise enabling or disabling the playback of one or more types of secondary media items or adjusting the speed at which secondary media items are played back, or a combination thereof.

34. The electronic device of claim 19, wherein the electronic device is a portable digital media player.

35. A method, comprising:

selecting a primary media item for playback on an electronic device;

selecting a secondary media item for playback on the electronic device; and ducking the primary media item by a ducking value while the second media item is played based upon a desired relative loudness difference, such that the relative loudness difference is substantially maintained and such that the primary media item is played at a ducked loudness level during an interval of concurrent playback in which the primary and secondary media items are both played back simultaneously on the electronic device, wherein ducking the primary media item comprises:

ducking in the primary media item prior to the concurrent playback interval; and ducking out the primary media item following the concurrent playback interval, wherein the rate at which the primary media item is ducked in and ducked out is variable depending on one or more characteristics of the primary media item.

* * * * *